US005739781A

United States Patent [19]
Kagey

[11] Patent Number: 5,739,781
[45] Date of Patent: Apr. 14, 1998

[54] SUB-RANGING ANALOG-TO-DIGITAL CONVERTER WITH OPEN-LOOP DIFFERENTIAL AMPLIFIERS

[75] Inventor: Mark R. Kagey, Fort Collins, Colo.

[73] Assignee: National Semiconductor Corporation, Santa Clara, Calif.

[21] Appl. No.: 727,056

[22] Filed: Oct. 8, 1996

[51] Int. Cl.$^6$ ................................................ H03M 1/00
[52] U.S. Cl. ..................... 341/155; 341/139; 341/158; 341/159
[58] Field of Search ...................... 341/155, 139, 341/158, 159

[56] References Cited

U.S. PATENT DOCUMENTS

| | | |
|---|---|---|
| 4,686,511 | 8/1987 | Koen ................................. 340/347 |
| 4,763,107 | 8/1988 | Koen et al. ........................ 340/347 |
| 5,184,130 | 2/1993 | Mangelsdorf ..................... 341/156 |
| 5,387,914 | 2/1995 | Mangelsdorf ..................... 341/156 |
| 5,459,465 | 10/1995 | Kagey ............................... 341/156 |
| 5,592,167 | 1/1997 | Caruso et al. .................... 341/159 |

OTHER PUBLICATIONS

Sehat Sutarja and Paul R. Gray, "A Pipelined 13–bit, 250–ks/s, 5–V Analog–to–Digital Converter", IEEE Journal of Solid–State Circuits, vol. 23, No. 6, Dec. 1988, pp. 1316–1323.

P. Vorenkamp and Johan P.M. Verdaasdonk, "WP 2.2" A 10b 50MS/s Pipelined ADC", 1992 IEEE International Solid–State Circuits Conference, Feb. 19, 1992, pp. 32 and 33.

Primary Examiner—Jeffrey A. Gaffin
Assistant Examiner—Jason H. Vick
Attorney, Agent, or Firm—Limbach & Limbach L.L.P.

[57] ABSTRACT

A sub-ranging analog to digital converter utilizes open loop differential gain amplifiers and analog switches to implement a pipeline. Each stage of the converter contains two fine range transfer amplifiers, sampling switches and hold capacitors, a low resolution sub-range analog to digital converter and a resistive ladder. The sampling switches behave as a digital to analog converter. Each stage then converts the held analog value to a digital code, which is used to operate the transfer switches to select the proper sub-range result for the next stage. The transfer switches are analog switches that perform the function of both the sampling and the sub-range transfer. The interstage amplifiers are simple open loop differential amplifiers with a rather imprecise absolute gain. Because the reference and the signal are both amplified by this imprecise gain, both the reference and the signal are amplified by the same amount. A preprocessing circuit transforms a single ended input to the analog to digital converter into four separate signals which, taken together, represent the input and reference information. Since the fine range transfer amplifiers are differential amplifiers they reject the common mode that might occur from stage to stage. However the fine range transfer amplifiers restore the signal to approximately the same common mode level at the input to each stage. Embodiments producing single or multiple output bits per stage with synchronous stages using either sub-range signal sample and hold amplifiers or dual purpose subrange transfer and sampling switches are disclosed.

34 Claims, 12 Drawing Sheets

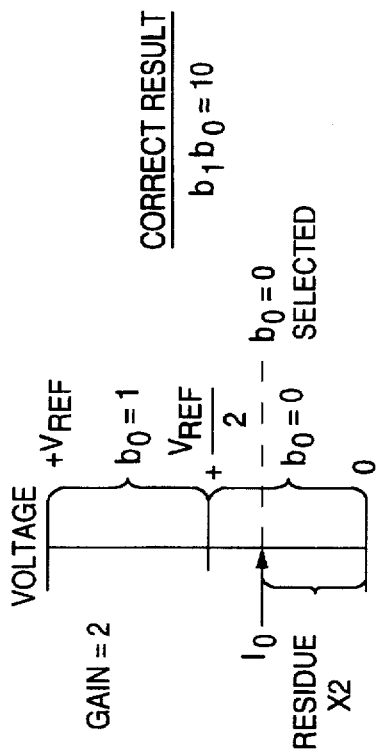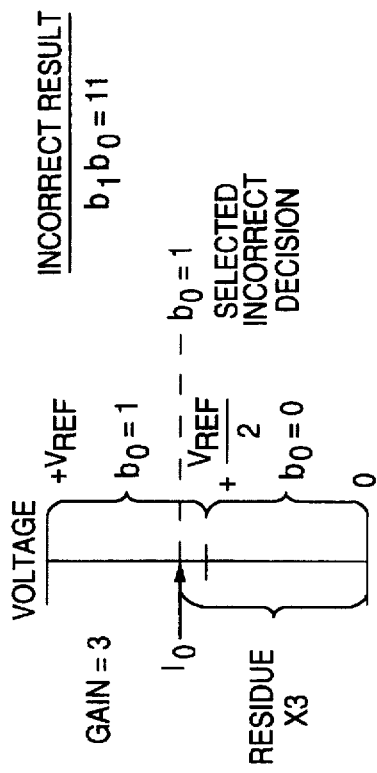
FIGURE 2B
FIGURE 2C (PRIOR ART)

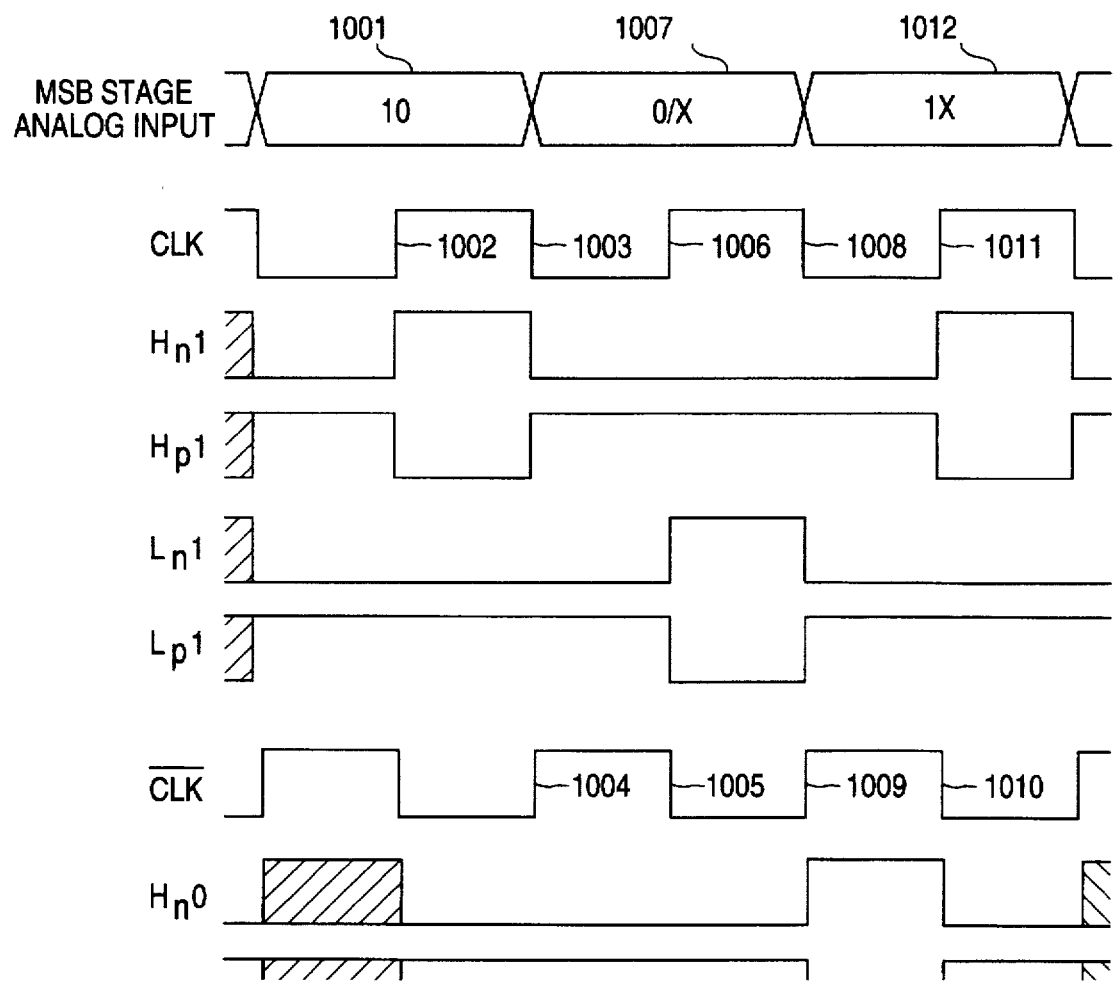

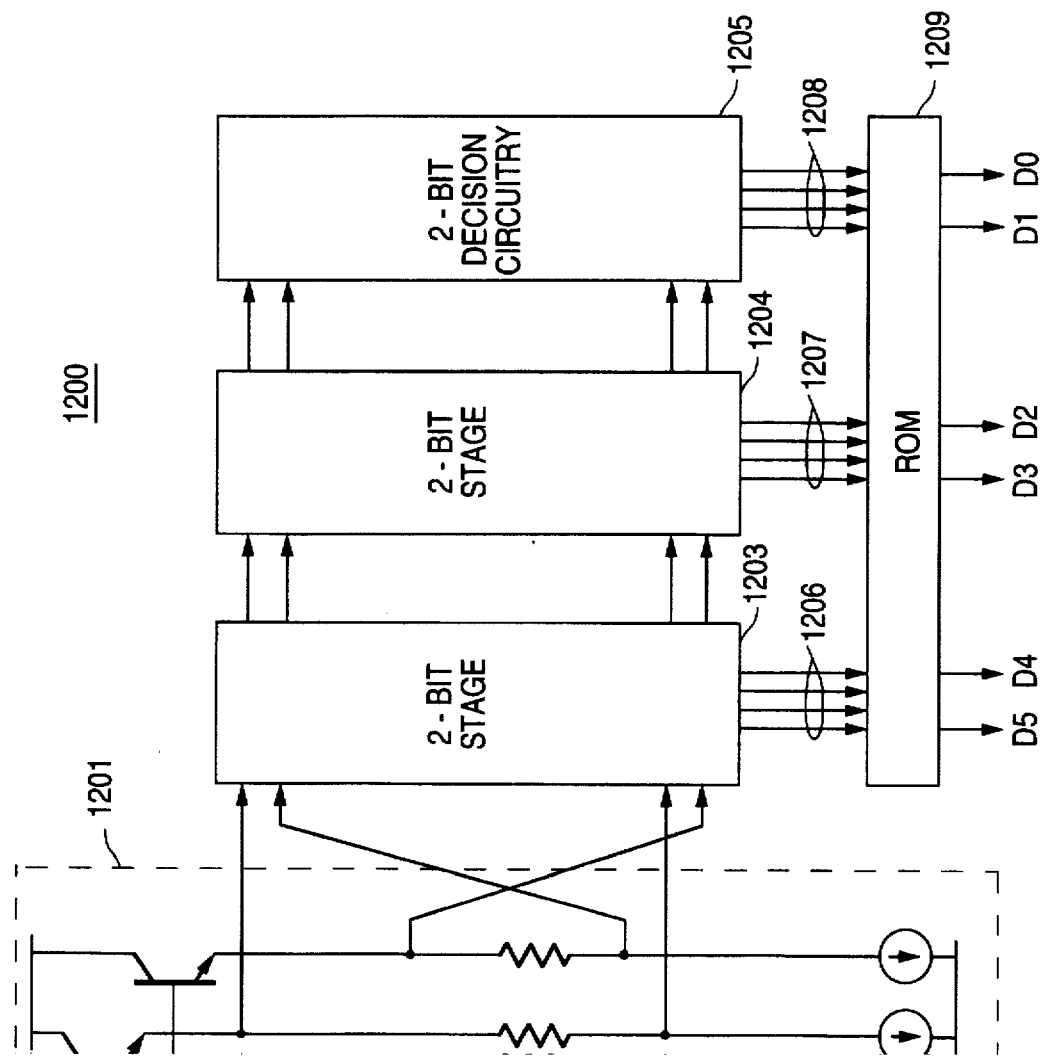

SUB-RANGING ANALOG-TO-DIGITAL CONVERTER WITH OPEN-LOOP DIFFERENTIAL AMPLIFIERS

BACKGROUND OF THE INVENTION

1. Field of the Invention

The present invention relates to the field of analog to digital converters, and specifically, to the field of pipelined sub-ranging analog to digital converters using residue amplifiers. Reference information and analog input are merged together and amplified using open loop free range transfer amplifiers, in contrast to conventional closed loop feedback circuits using operational amplifiers.

2. Description of the Related Art

Some analog to digital converters are designed to first resolve the input voltage range into coarse steps which correspond to different codes of the more significant digital output bits. After the appropriate coarse step is selected, the voltage range corresponding to that coarse step is then resolved into fine steps which correspond to different codes of the less significant digital output bits. This type of analog to digital converter architecture is known as a sub-ranging analog to digital converter.

In pipeline video-rate analog to digital converters, the first stage operates on the most recent sample, while the next stage operates on the sub-range result determined from the previous sample, and so on. Each stage holds its intermediate result temporarily in a sample and hold amplifier. This concurrency allows a complete conversion to N bits per single clock cycle, unlike successive approximation converters which require N clock cycles for an N bit conversion.

FIG. 1A illustrates a conventional pipelined radix-2 sub-ranging analog to digital converter 100 producing one digital output bit per pipeline stage. An analog input Ain is presented to the first pipeline stage 101 which produces the most significant binary output digit bN. During the next subsequent pipeline stage in the next clock cycle the next most significant bit stage 113 produces the next most significant binary output digit bN-1. After N+1 clock cycles, the least significant output bit b0 is produced by the final pipeline stage. The final analog residue 115 represents the quantization error inherent in the conversion which is beyond the resolution of the converter.

In the field of analog to digital conversion, increasing the speed and precision of the conversions is desirable. For example, 5 MHz sampling rates are needed in hand held CCD document scanners; high end scanners and low end video applications require 10 MHz sampling rates; and standard broadcast video camcorders need 20 MHz sampling. Furthermore, high end video applications take advantage of oversampling at 25 MHz; automotive collision avoidance radar receivers undersample at 25 MHz, and medical ultrasound scanners and professional broadcast studio video equipment want 40 MHz sampling rates. In addition, digital communication applications undersample in the 20-to-25 MHz range.

Today, analog to digital converters need to produce as much as 40 Megasamples per second (MS/sec) at 12 bits per sample while still providing a reasonably low latency. There are several techniques currently used to achieve the speeds. For example, parallel encoded flash, multistep, pipeline and time interleaved successive approximation are some of the techniques.

Flash analog to digital encoding is the fastest method of conversion, because it is essentially performed in a single step. For an N-bit encoded output, the input voltage is sent to $2^N$ comparators which each compare the input to a different reference voltage. All of the comparators whose reference voltage is higher than the input voltage will produce a logical true output. A priority encoder then generates a digital output corresponding to the lowest comparator whose output was activated. The delay time from input to output equals the sum of comparator plus encoder delays. Although this latency does not increase significantly with the size of the encoded output, the sheer size of the circuit essentially doubles with each additional output bit desired. Thus, the size of flash analog to digital converters makes that approach prohibitively expensive for many modern applications.

Multistep encoding is a variant on the simple parallel flash encoding. In the first stage, the four most significant bits are generated by a standard four bit flash circuit similar to the one discussed above. A 4-bit digital to analog converter then converts the output of the first stage back to analog. The difference in voltage between the input and the output of the converter is then fed into a second stage. The second stage has a reference voltage which is $2^{-4}$ times (one sixteenth) the reference voltage used in the first stage. The second most significant four bits are produced by the second stage, and another four bit digital to analog converter converts the value back into an analog signal, which is subtracted from the difference obtained from the subtractor of the previous stage. Finally, the last stage has a reference voltage which is $2^{-4}$ times the voltage of the previous stage, or $2^{-8}$ (one two-hundred-fifty-sixth) times the original reference voltage. This stage produces the four least significant bits of the result. All twelve bits are then latched, and the output is available for use.

There are several other types of popular analog to digital converters which use charge balancing on a capacitor to facilitate analog to digital conversion. Some of those methods include voltage-to-frequency conversion, single slope integration, dual slope integration, delta-sigma converters and switched capacitor converters.

Several of the above-mentioned analog to digital converter strategies can be pipelined. A typical N-bit pipelined analog to digital converter consists of J, K-bit stages, where J*K=N. For example, five stages (J=5) each producing 2 bits (K=2) would result in a 10 bit converter.

The pipeline analog to digital converter has traditionally been constructed as shown in FIGS. 1A and 1B. The analog to digital converter shown in FIG. 1A has J stages with overall analog to digital converter resolution of N. Each stage resolves K bits some of which may be redundant bits used in the correction of errors made in previous stages. In the example illustrated in FIGS. 1A and 1B, K is one. The redundant bits are removed by a process called digital error correction, and this process makes the converter more tolerant of certain types of errors.

Each stage of the converter in FIG. 1A contains a sample and hold amplifier, which consists of sampling switches and hold capacitors, a low resolution sub-range analog to digital converter, a low resolution digital to analog converter and a subtractor. Each stage also includes a residue amplifier including a closed loop negative feedback configured operational amplifier. In operation, each stage samples and holds the analog output from the previous stage. Each stage then converts the held analog value to digital code. The digital code is then converted back to analog. Finally, the digital to analog output is subtracted from the held input, producing an analog residue (analog remainder) that is amplified and then sent on to the next stage.

In the standard pipeline analog to digital architecture (also known as the residue style architecture), the analog to digital converter reference levels are fixed in size. For example, each stage might have 1 volt range. During the binary subranging process, a determination is made that the signal resides in either the upper half volt range or the lower half volt range. Then a subtraction of a half volt either does or does not occur respective of that determination and then the signal is a residue which is now relative to the appropriate half volt range. But since each range is exactly 1 volt in size, the signal which is relative to a half volt subrange must be amplified precisely by a factor of two to be relative to the 1 volt fixed range size. Since the subrange is exactly half of a normal range, an exact gain of 2 is required to restore the signal to a level relative to the normal range. The subranging process described here has the effect of providing a precise gain of 2 to the reference and a precise gain of 2 to the signal but these gains are achieved by two different mechanisms. On the reference side, the subrange of half size becoming full size provides a precise gain of 2. On the signal side a closed loop operational amplifier with a precise closed loop gain of 2 is provided. To achieve high accuracy this reference gain of 2 and the signal gain of 2 must be precisely matched to within the resolution of the analog to digital converter.

The operational amplifier in the residue amplifier of each stage has closed loop feedback in order to achieve the precise gain required. This negative feedback tends to sacrifice speed for accuracy, because the circuit does not settle until signals have propagated through the amplifier and feedback path several times. The closed loop operational amplifier also brings with it other detrimental side effects such as higher power and supply headroom problems.

FIG. 1B shows a single stage 100 of a pipelined analog to digital converter. FIG. 1B illustrates a conventional pipelined radix-2 sub-ranging analog to digital converter stage that produces one digital output bit suitable for use in the sub-ranging converter illustrated in FIG. 1A. FIG. 1A shows a multistage pipeline architecture 101 using the single stage 100 of FIG. 1B. In FIG. 1B, the analog input Vresi-1 is sampled and held by the sample and hold circuit 102. The result is then converted into a 1-bit digital code by a analog to digital subconverter 103. In the 1-bit stage shown in FIG. 1B, the digital subconverter 103 is a simple comparator dividing the voltage range in half at +Vref/2. In the first stage 104 of the multistage converter 101 shown in FIG. 1A, the digital output bit bN is the most significant bit of the output. The digital code 105 is then used by a local digital to analog converter 106 to create the analog equivalent 107 of the 1-bit digital code. A subtractor 108 then subtracts the analog equivalent of the 1-bit digital code from the original analog input 109 to create a residue 110, which is essentially the analog remainder. A multiplier 112 then multiplies the resulting analog residue 110 by two to produce the analog output Vresi 111, which is sent to the next stage. The resulting residue can be calculated from the following formula.

$$Vres_i = 2^K * (Vres_{i-1} - Vdac_i) \quad (1)$$

Each stage can be identically designed, unlike the multistage flash encoding discussed earlier, in which each successive stage has a lower reference voltage. In the pipelined analog to digital converter 101, because the residues are multiplied by $2^K$, each successive stage has the same range of input voltages, rather than having that range geometrically decreasing toward zero.

If the digital to analog converter in each stage is linear, the digital to analog converter output will be represented as follows.

$$Vdac_i = D_i * 2^{-K} * Vref \quad (2)$$

In Equation 2, $D_i$ is the binary representation of the K-bit digital code determined in each stage. $D_i * 2^{-K}$ merely represent the fraction of $V_{ref}$ which has already been encoded and is to be subtracted from the analog remainder $Vresi_{i-1}$. $V_{ref}$ is set such that the input voltage $Vres_i$ will always be less than $V_{ref}$. The remainder is multiplied by $2^K$ before being sent to the next stage.

If K=1, the digital to analog converter in each stage only has two possible output voltages. This digital to analog conversion will always be linear, since there is always a straight line that can be drawn between two points. In this case, the ideal gain of each converter stage is two. By substituting K=1, Equations 1 and 2 produce the following residue equation.

$$Vres_i = 2 * Vres_{i-1} - D_i * Vref \quad (3)$$

$D_i = 1$ if $Vresi_{i-1} > +Vref/2$, and $$D_i = 0 \text{ if } Vres_{i-1} < +Vref/2 \quad (4)$$

In prior art analog-to-digital converter stages, the multiplier 112 is typically implemented as an operational amplifier circuit having negative feedback. The operational amplifier typically is designed to have a very high gain. Often, in order to achieve very high gain, there are at least two gain stages in the amplifier 112. By having more than one gain stage, the latency between changes in the output to changes is the inputs is increased. Furthermore, the negative feedback circuit implemented in order to produce a gain of exactly two increases the settling time since the feedback loop introduces farther latencies as the operational amplifier inputs change as a result of changes in the outputs. In the nonideal real world it is impossible to exactly realize the transfer function of Equation 3. A real operational amplifier does not have infinite gain and does not settle instantaneously, but rather has a finite gain and nonzero settling time. Errors due to the finite gain and nonzero settling time in stage i are represented by $\epsilon_i$. $Vofs_i$ represents the total offset in stage i due to the sum of charge injection effects and operational amplifier offset. When the three error factors $\alpha_i$, $\epsilon_i$ and $Vofs_i$ are introduced into the derivation, the real world transfer function is as follows.

$$Vres_i = [(2+\alpha_i) * Vres_{i-1} - (1+\alpha_i) D_i * Vref] (1-\epsilon_i) + Vofs_i \quad (5)$$

Gain variances in the amplifier 112 of FIG. 1A are created by capacitor mismatch and by finite operational amplifier gain and settling. Any of the above errors which affect the gain will cause differential nonlinearity problems with the converter. If the cascade of N converters has a gain larger than $2^N$ and the overall error is more than 1 least significant bit, then at least one analog to digital converter output code will correspond to a range of input voltages greater than the minimum required resolution of the converter. On the other hand, if the gain of the cascade is less than $2^N$ by at least one least significant bit, then missing output codes will result since some output codes will be skipped as the input changes incrementally.

Moreover, if the output residue of a stage happens to be above $+V_{ref}$ or below 0 for any reason, then the output bits of remaining subsequent stages will all latch to +1 or 0 respectively. This can occur as a consequence of any of the previously mentioned sources of error, such as too large a gain or vertical or horizontal shifting, if the input voltage just happens to place the output of that stage outside the acceptable range. The phenomenon occurs because an output above $+V_{ref}$ or below 0 necessarily supplies the next stage with an input which is outside its intended range. That stage will supply the following stage with an output which is twice is far out of range as its input was. Essentially, once the output of one stage goes out of range, that excess is multiplied by the gain factor for each additional stage. After very few stages, all the remaining stages are outputting residues that are essentially either the positive or negative supply voltage, and all the remaining coded bits coming out after that stage reaches the power supply limitation and are meaningless.

As is apparent from the above discussion, it would be desirable to produce an analog to digital converter having gain insensitivity, higher speed operation, less complexity, less sensitivity to component values, lower power supply requirements and less power consumption.

SUMMARY OF THE INVENTION

In the field of analog to digital converters, it has been difficult to fulfill the high resolution, high speed and low power potential of pipelining due to the use of precision gain closed loop operational amplifiers in the signal path in each stage. The required settling time and power required of these amplifiers, to achieve a given resolution, work against the speed and low power goals of analog to digital converter designers.

The objects of the present invention include producing a sub-ranging analog to digital converter exhibiting gain insensitivity in the amplifiers and having open loop (non-feedback) differential amplifiers which exhibit high speed operation.

According to the present invention, a new type of sub-ranging analog to digital converter utilizes open loop differential gain amplifiers and analog switches to implement a pipeline wherein the sub-ranging occurs in multiple stages, each stage resolving the input to a freer level than the previous stage.

The new concept eliminates the precision gain closed loop operational amplifiers and replaces them with an open loop differential amplifier with imprecise gain termed a "fine range transfer" amplifier. By utilizing fine range transfer amplifiers instead of precision closed loop operational amplifiers in negative feedback circuits, a number of advantages are achieved.

Because the reference voltages are amplified through the same path as the sub-range signals, gain insensitivity is achieved using the present invention. Because high precision of the amplifier gain is not required, open loop amplifiers having no feedback are used, thereby allowing higher speed operation according to the present invention. Because complex operational amplifier feedback circuits are replaced with very simple fine range transfer amplifiers, lower complexity, smaller die sizes and lower production costs are achieved according to the present invention. Because the precise gain is not required according to the present invention, the circuit according to the present invention is less sensitive to component values, thereby producing robust immunity to process variations. Because the present invention uses open loop amplifiers, it does not require high (multiple) power supplies as are often required for high speed high gain operational amplifiers. Additionally, the open loop amplifiers according to the present invention use less power than closed loop feedback configured operational amplifiers.

According to a preferred embodiment of the present invention, each stage of the converter contains two fine range transfer amplifiers, sampling switches and hold capacitors, a low resolution sub-range analog to digital converter and a resistive ladder. The sampling switches behave as a digital to analog converter. In operation, each stage amplifies the analog sub-range signal which was sampled and held from the previous stage. Each stage then converts the held analog value to a digital code. The digital code is used to operate the transfer switches to select the proper sub-range result for the next stage. According to the preferred embodiment of the present invention, the transfer switches are analog switches that perform the function of both the sampling and the sub-range transfer, the result is held on the hold capacitors at the input of the fine range transfer amplifier of the next stage.

To achieve accuracy, in conventional converters the reference gain of 2 and the signal gain of 2 must be precisely matched to within the resolution of the analog to digital converter. According to the present invention, the precise gain requirement is eliminated because the reference is not fixed but is actually amplified through the same amplification that the signal itself undergoes. Therefore the reference gain and the signal gain are inherently equal even if neither is precisely a gain of 2. The interstage amplifiers according to the present invention are simple open loop differential amplifiers with a rather imprecise absolute gain. But since the reference and the signal are both amplified by this imprecise gain, both the reference and the signal are amplified by the same amount.

According to the present invention, a single ended input to the analog to digital converter is transformed into four separate signals which, taken together, represent the input and reference information. This merging of the input and the reference occurs only once at the input of the analog to digital conversion and is performed by a preprocessing circuit. The input and reference signals are merged as they pass through all subsequent gain stages together. Therefore, gain matching of signal and reference paths is achieved precisely even though the absolute gain of any stage may not be itself precise.

Since the fine range transfer amplifiers are differential amplifiers they reject the common mode that might occur from stage to stage. However the fine range transfer amplifiers restore the signal to approximately the same common mode level at the input to each stage.

These and other features and advantages of the present invention are fully described in the Detailed Description of the Invention with reference to the Figures.

The Figures are more thoroughly described in the Detailed Description of the Invention.

DETAILED DESCRIPTION OF THE INVENTION

Figure 1A:
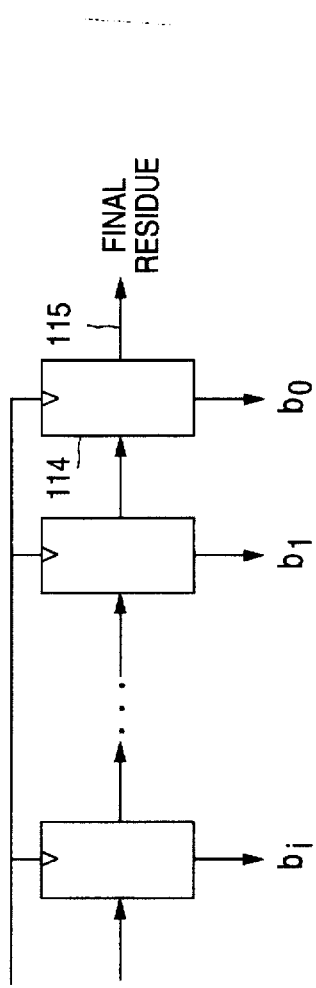
FIG. 1A illustrates a conventional pipelined radix-2 sub-ranging analog to digital converter producing one digital output bit per pipeline stage.
Figure 1B:
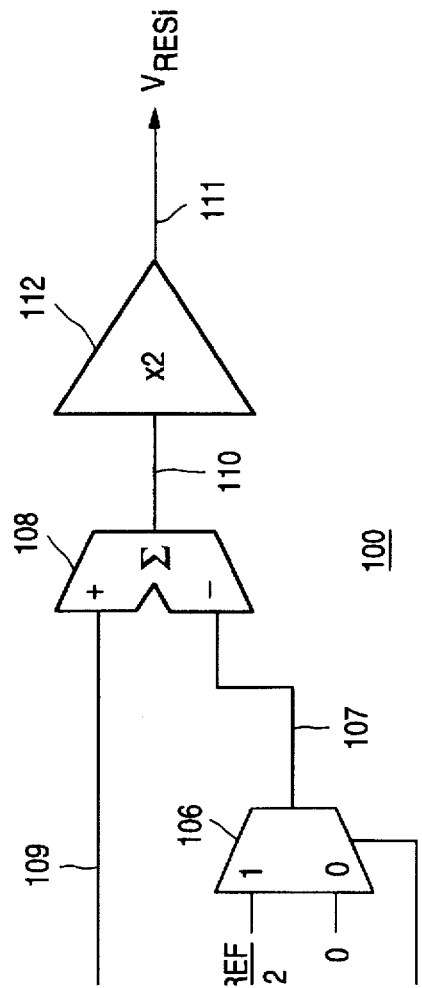
FIG. 1B illustrates a conventional pipelined radix-2 sub-ranging analog to digital converter stage that produces one digital output bit suitable for use in the sub-ranging converter illustrated in FIG. 1A.
Figure 2A:
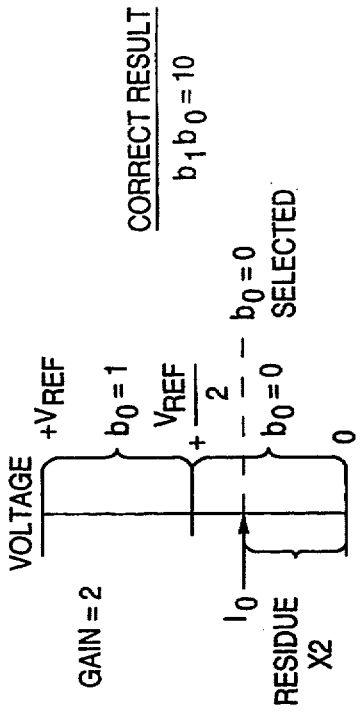
FIG. 2A graphically illustrates the selection of the most significant digital output bit in a conventional two stage radix-2 sub-ranging analog to digital converter such as illustrated in FIGS. 1A and 1B.
Figure 2B:
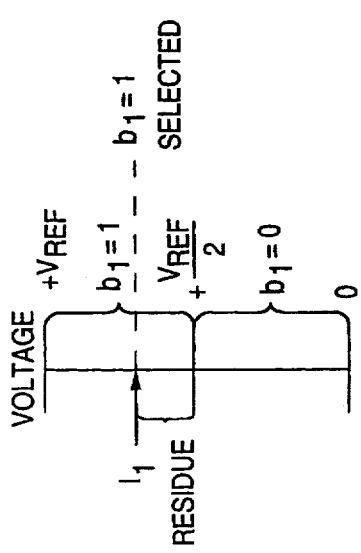
FIG. 2B graphically illustrates the selection of the least significant digital output bit in a conventional two stage radix-2 sub-ranging analog to digital converter such as illustrated in FIGS. 1A and 1B when the gain of the residue amplifier from the preceding stage is exactly two.
Figure 2C:
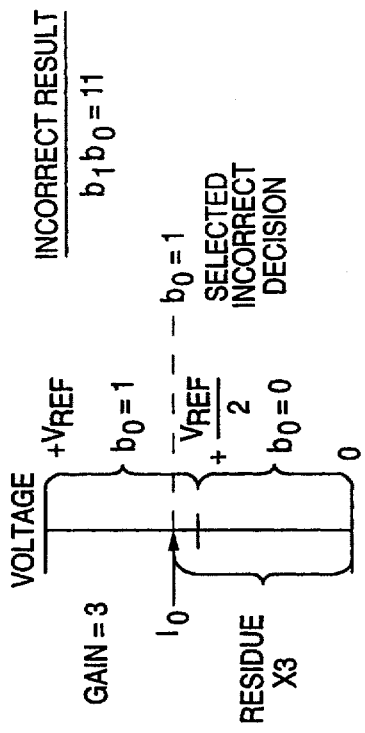
FIG. 2C graphically illustrates the erroneous selection of the least significant digital output bit in a conventional two stage radix-2 sub-ranging analog to digital converter such as illustrated in FIGS. 1A and 1B when the gain of the residue amplifier from the preceding stage is three, which is fifty percent greater than the specification gain of two.

FIGS. 2A, 2B and 2C graphically illustrate two 2-bit analog-to-digital conversions in a conventional pipelined converter. FIG. 2A illustrates the selection of the most significant digital output bit in a conventional two stage radix-2 sub-ranging analog to digital converter such as illustrated in FIGS. 1A and 1B. The valid analog input range for any given stage is from 0 to +Vref. For analog residue inputs between +Vref/2 and +Vref, a binary code of 1 is selected, while for analog residue inputs between 0 and +Vref/2, a binary code of 0 is selected. In FIG. 2A, an analog input voltage I1 to the most significant bit stage is approximately +11 Vref/16, which falls in the b1=1 decision range. The residue from the first stage is approximately 3 Vref/16. After being multiplied by the radix factor of two, the residue input I0 into the second stage is approximately 3 Vref/8.

FIG. 2B graphically illustrates the selection of the least significant digital output bit in a conventional two stage radix-2 sub-ranging analog to digital converter such as illustrated in FIGS. 1A and 1B when the gain of the residue amplifier from the preceding stage is exactly two. FIG. 2B illustrates the selection of the least significant bit b0. Because 3 Vref/8 is less than Vref/2, a binary digit of 0 is selected as b0 in the least significant stage.

FIG. 2C graphically illustrates the erroneous selection of the least significant digital output bit in a conventional two stage radix-2 sub-ranging analog to digital converter such as illustrated in FIGS. 1A and 1B when the gain of the residue amplifier from the preceding stage is three, which is fifty percent greater than the specification radix gain of two. If the gain of the amplifier 112 is three instead of two, then the analog residue I0 input into the second stage is erroneously 9 Vref/16 rather than its correct value of 3 Vref/8. Because 9 Vref/16 is greater Vref/2, the digit of b0=1 is incorrectly selected.

Figure 3B:
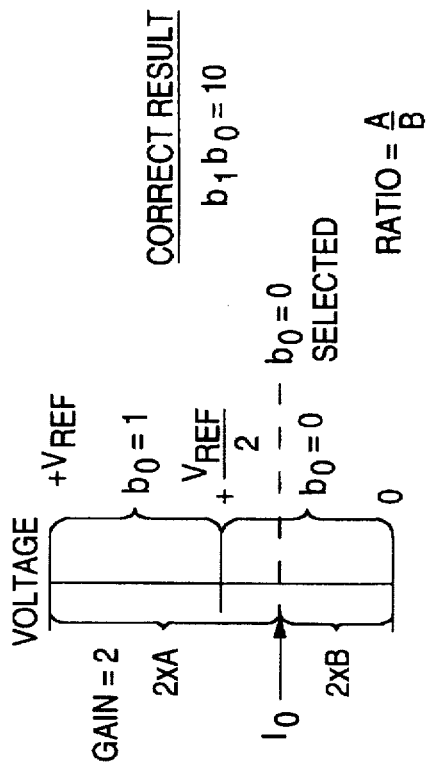
FIG. 3B graphically illustrates the selection of the least significant digital output bit in a two stage radix-2 sub-ranging analog to digital converter according to the present invention when the gain of the sub-range signal amplifier from the preceding stage is exactly two.
Figure 3C:
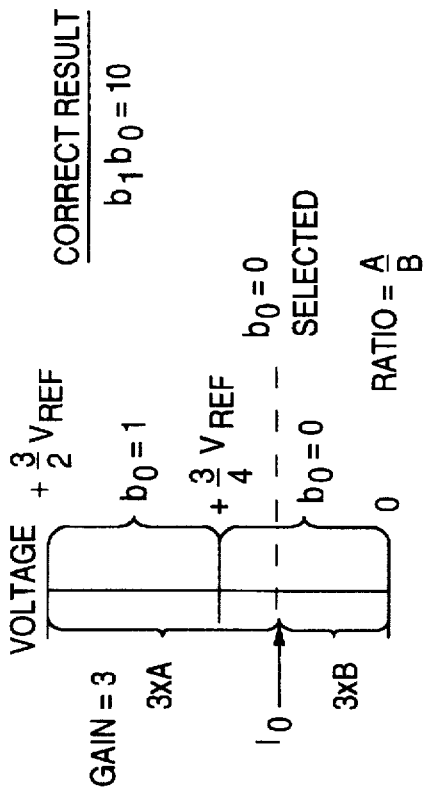
FIG. 3C graphically illustrates the correct selection of the least significant digital output bit in a two stage radix-2 sub-ranging analog to digital converter according to the present invention when the gain of the sub-range signal amplifier from the preceding stage is three, which is fifty percent greater than the specification gain of two.
Figure 3B:
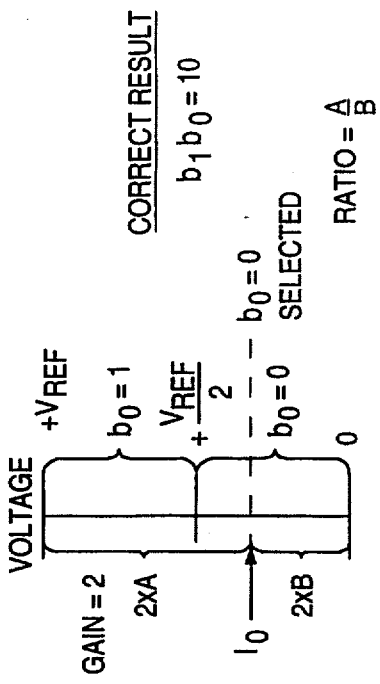
Figure 3C:
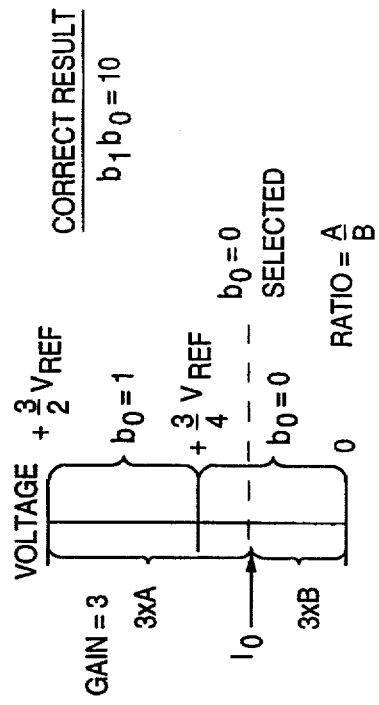
Figure 3A:
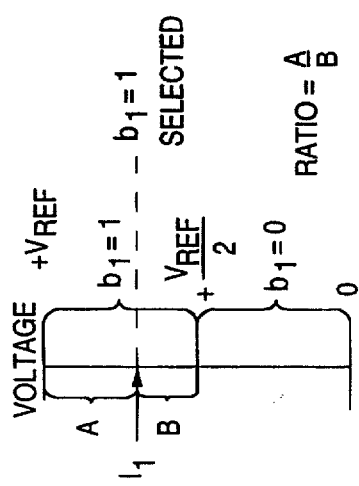
FIG. 3A ally illustrates the selection of the most significant digital output bit in a two stage radix-2 sub-ranging analog to digital converter according to the present invention.
Figure 4:
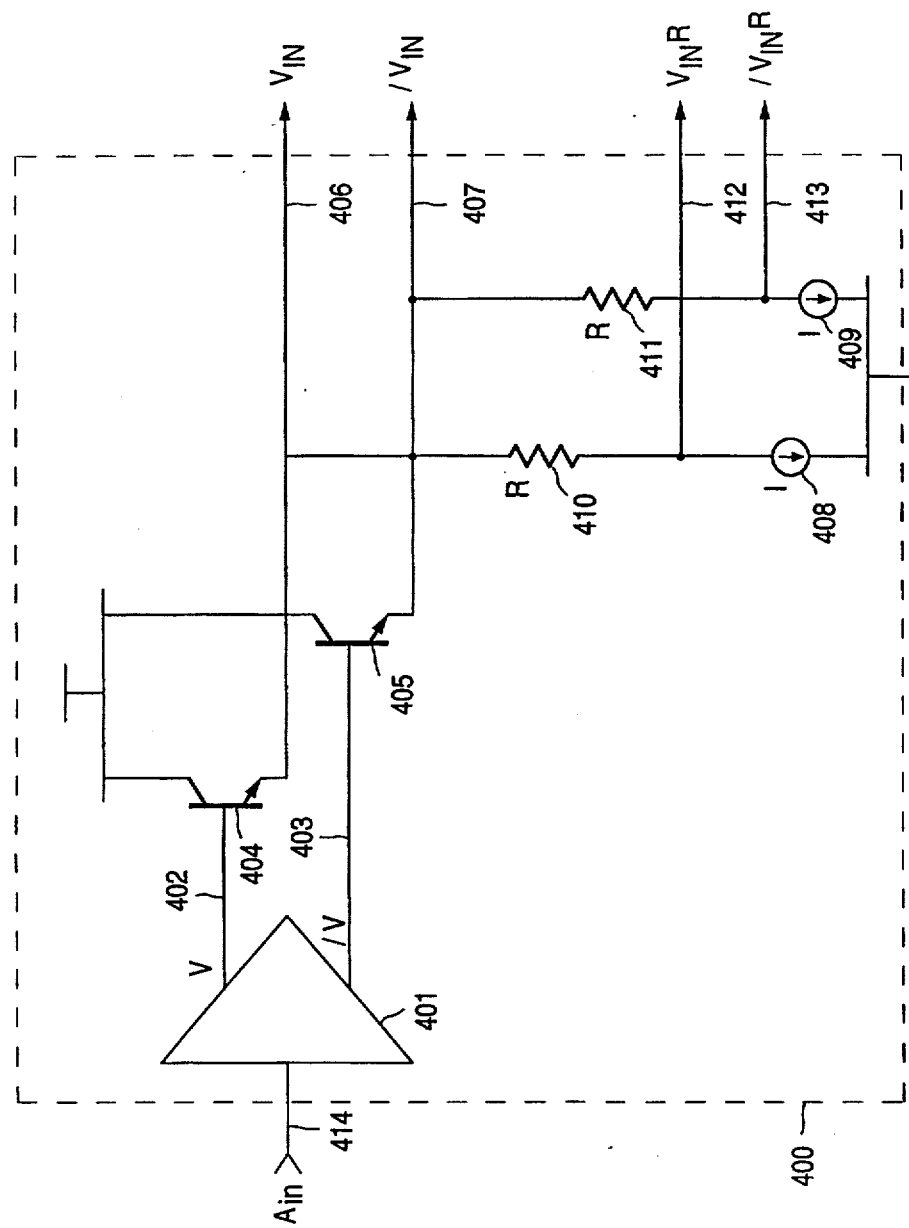
Figure 5:
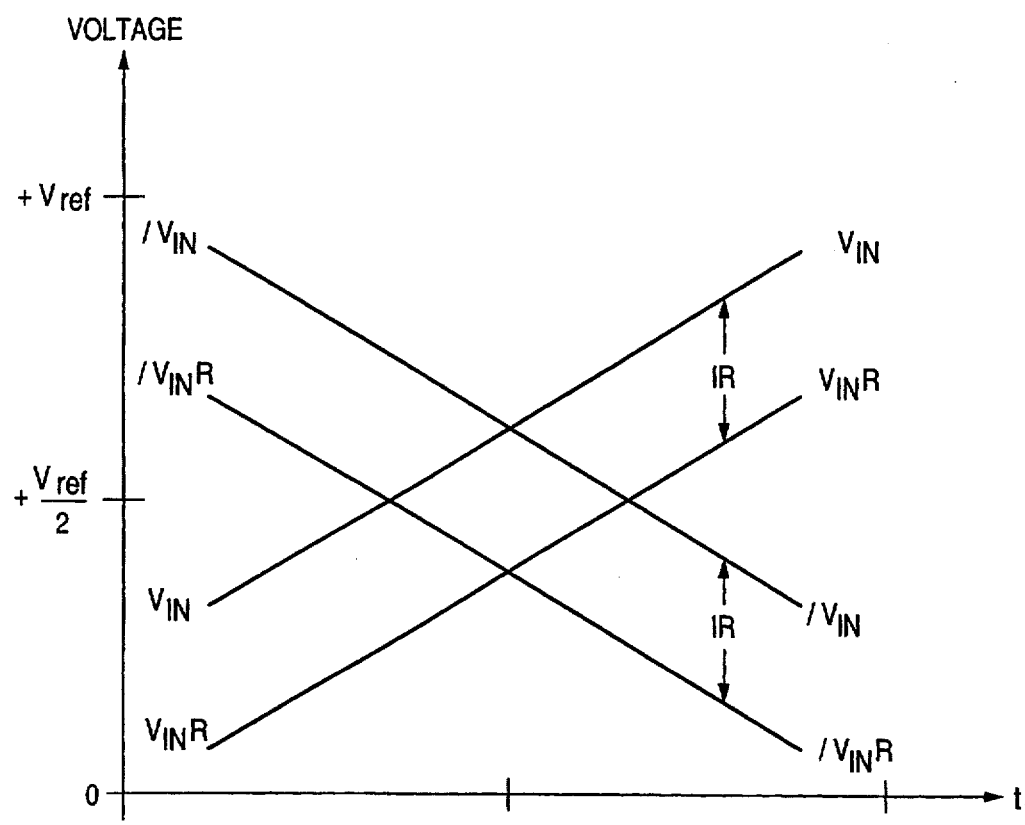
Figure 6:
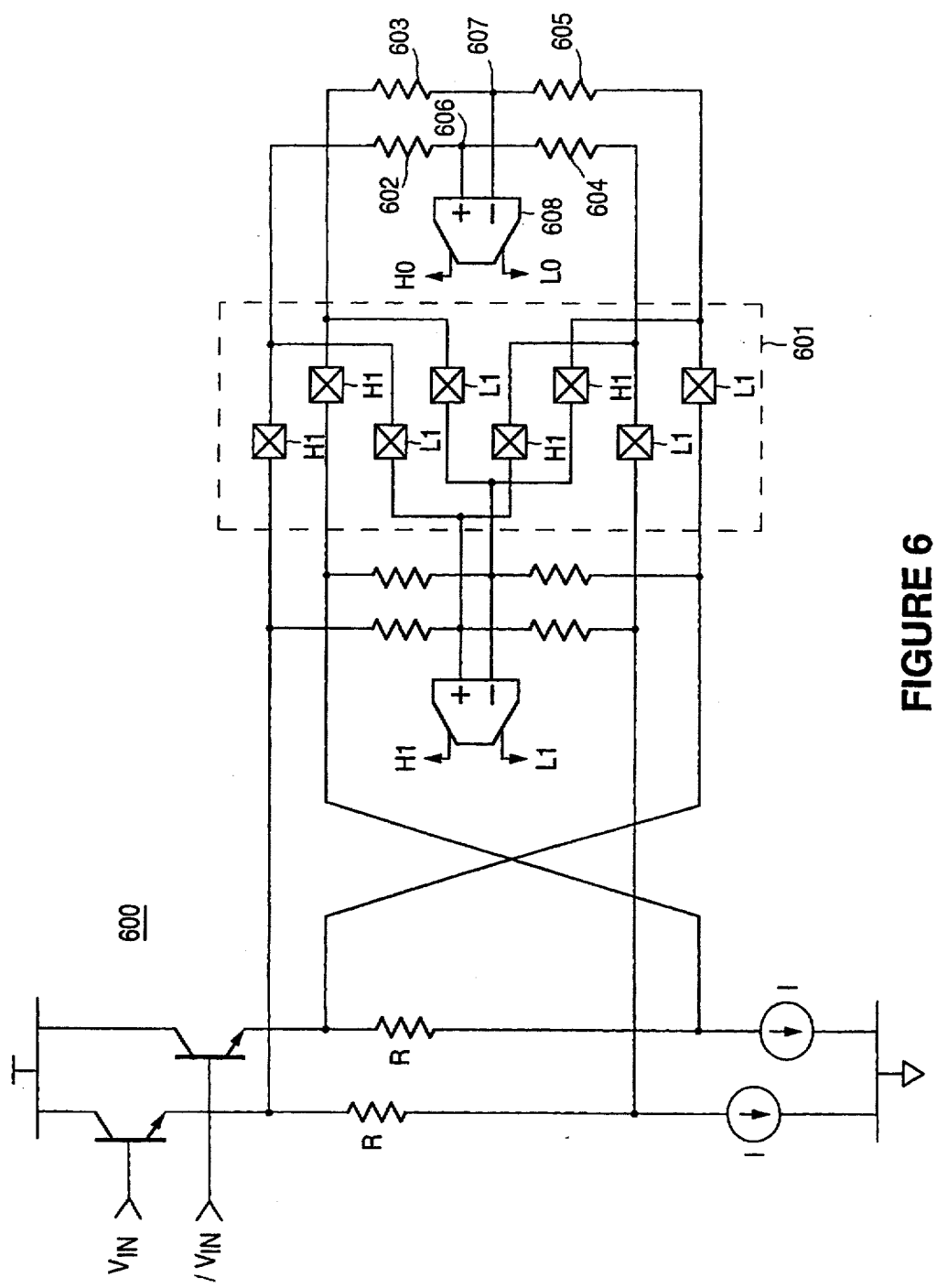
Figure 7:
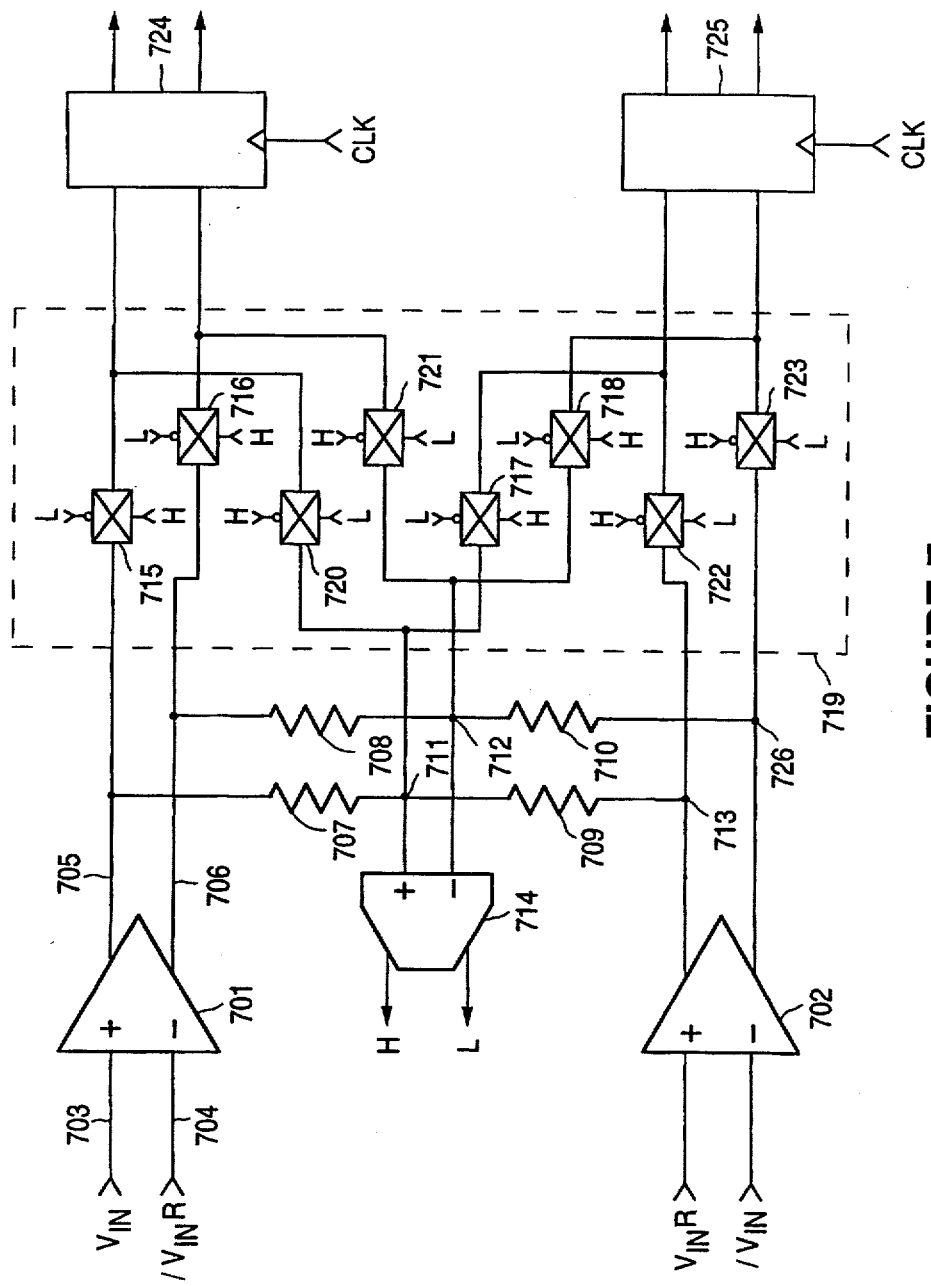
Figure 8:
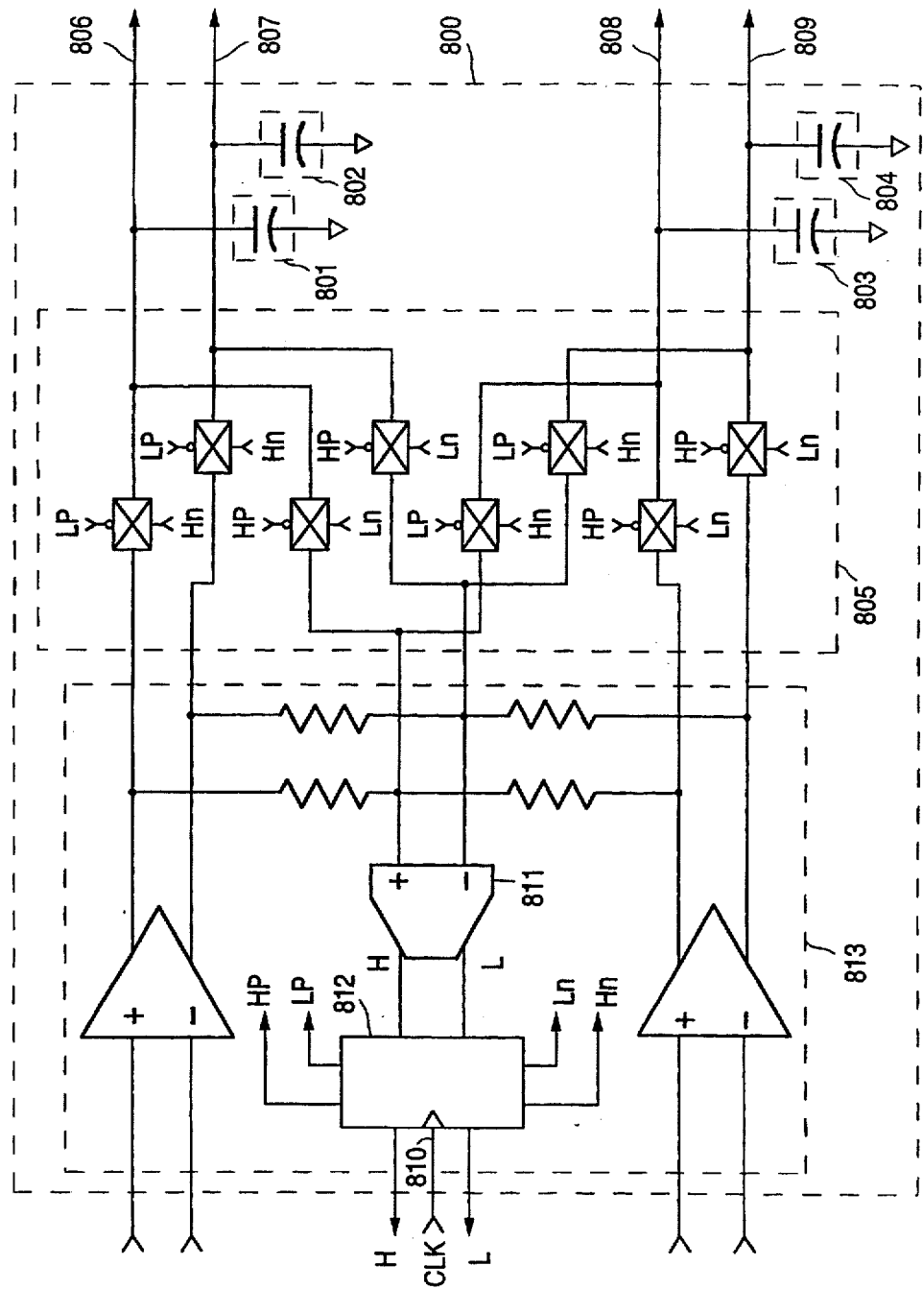
Figure 9:
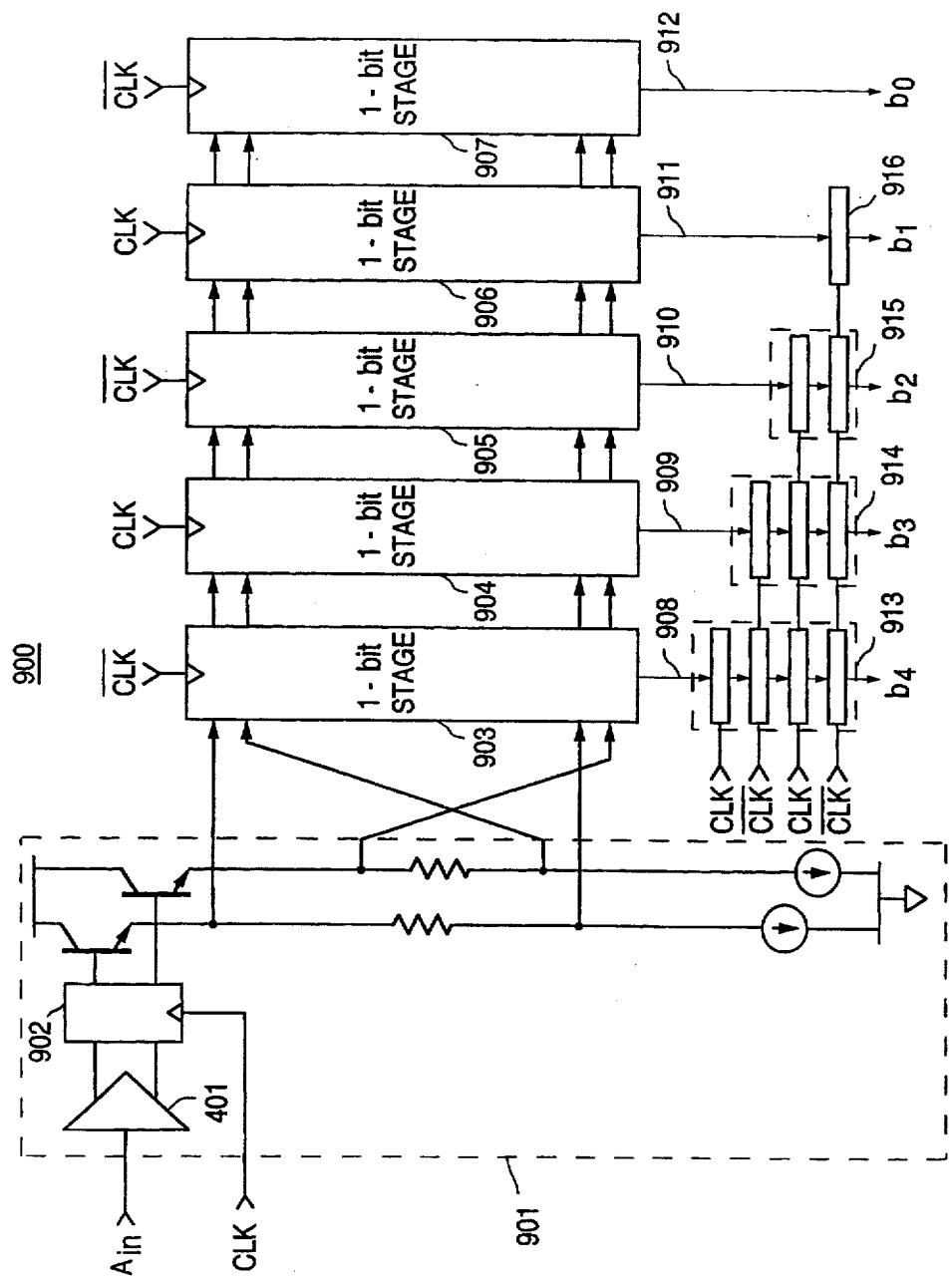

FIG. 3A graphically illustrates the selection of the most significant digital output bit in a two stage radix-2 sub-ranging analog to digital converter according to the present invention. The example illustrated in FIG. 3A is the same example illustrated in FIG. 2A. The ratio of the voltage range within the selected decision range above the input I1 to the voltage range within the selected decision range below the input I1 is A/B, which is (Vref−I1)/(I1−Vref/2).

FIG. 3B graphically illustrates the selection of the least significant digital output bit in a two stage radix-2 sub-ranging analog to digital converter according to the present invention when the gain of the sub-range signal amplifier from the preceding stage is exactly two. The decision criteria shown is exactly the same as illustrated in FIG. 2B. The ratio of the valid voltage range above I0 to the valid voltage range below I0 is equal to A/B.

FIG. 3C graphically illustrates the correct selection of the least significant digital output bit in a two stage radix-2 sub-ranging analog to digital converter according to the present invention when the gain of the sub-range signal amplifier from the preceding stage is three, which is fifty percent greater than the specification gain of two. The gain of three caused an erroneous digit selection in the prior art example illustrated in FIG. 2C. However, in the present invention, no errors result even though the gain factor is erroneous.

According to the present invention, not only is the sub-range signal multiplied by the gain factor, but also the reference voltages are multiplied by the gain factor. Therefore, the selected subrange from the previous stage is multiplied by the gain factor so that the valid input range for the second stage is 3 *Vref/2. The ratio of the valid input range above the sub-range signal value to the valid input range below the sub-range signal value (A/B) is preserved.

The decision regions are also adjusted according to the gain factor of the previous stage. Thus, b0=1 is selected when the analog sub-range signal is between 3 Vref/4 and 3 Vref/2, while b0=0 is selected when the analog sub-range signal is between 0 and 3 Vref/4.

Figure 4:
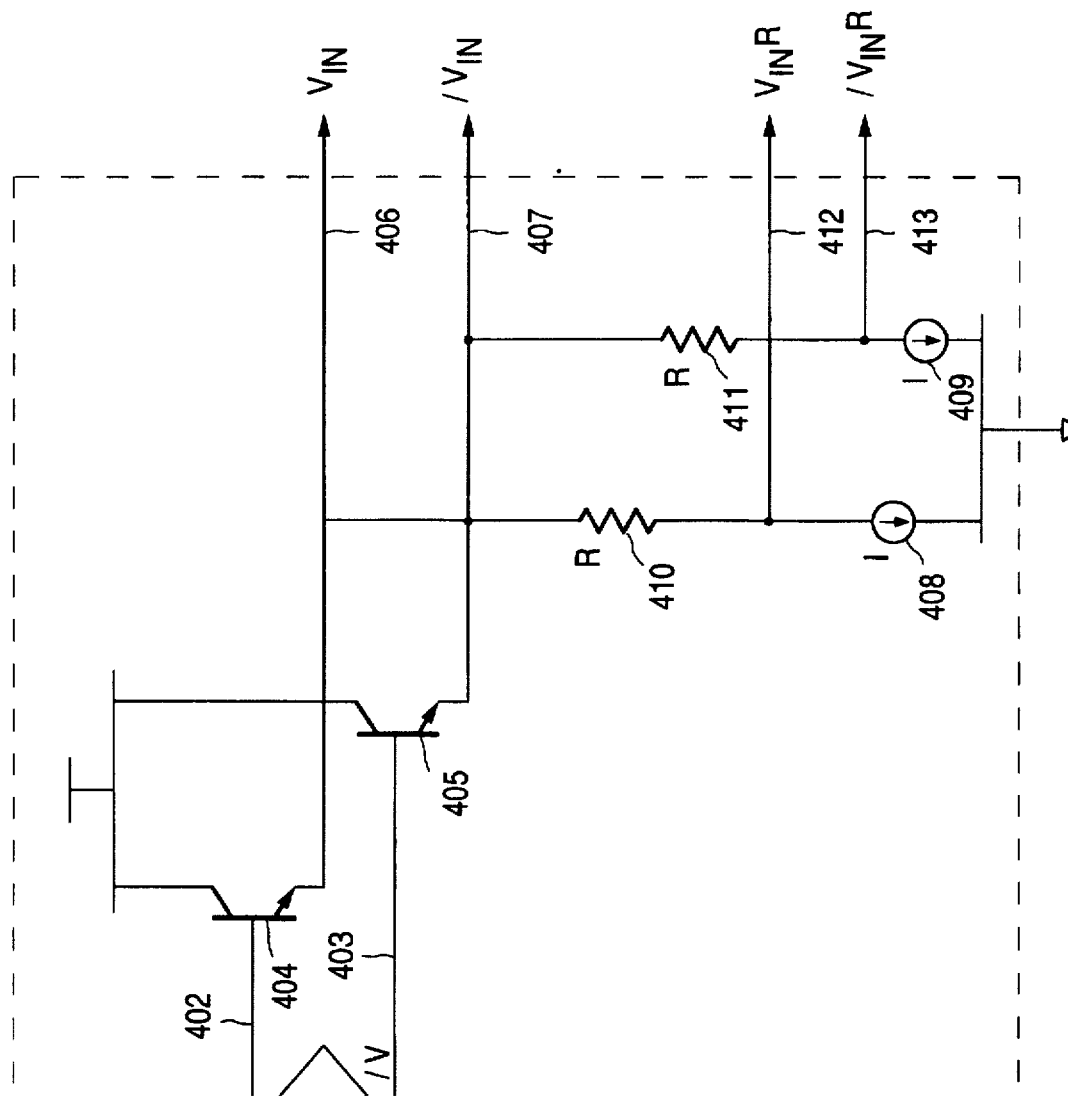
FIG. 4 illustrates an unclocked analog input preprocessing block according to the present invention which accepts the analog input voltage as input and which produces as outputs the buffered non-inverted sub-range signal input, the buffered inverted reference level shifted sub-range signal input, the buffered non-inverted reference level shifted sub-range signal input and the buffered inverted sub-range signal input to be input to the most significant sub-ranging converter stage.

FIG. 4 illustrates an unclocked analog input preprocessing block 400 according to an aspect of the present invention. The preprocessing block accepts the analog input voltage as input and produces as outputs the buffered non-inverted sub-range signal input, the buffered inverted reference level shifted sub-range signal input, the buffered non-inverted reference level shifted sub-range signal input and the buffered inverted sub-range signal input to be input to the most significant sub-ranging converter stage. The analog input Ain 414 is split into a complementary pair of analog signals by a differential buffer 401. The differential buffer 401 produces complementary analog outputs 402 and 403. The analog outputs are "complementary" because their analog sum equals a constant. Thus, the sum of the voltages from the two outputs 402 and 403 of the differential buffer 401 is constant.

Figure 5:
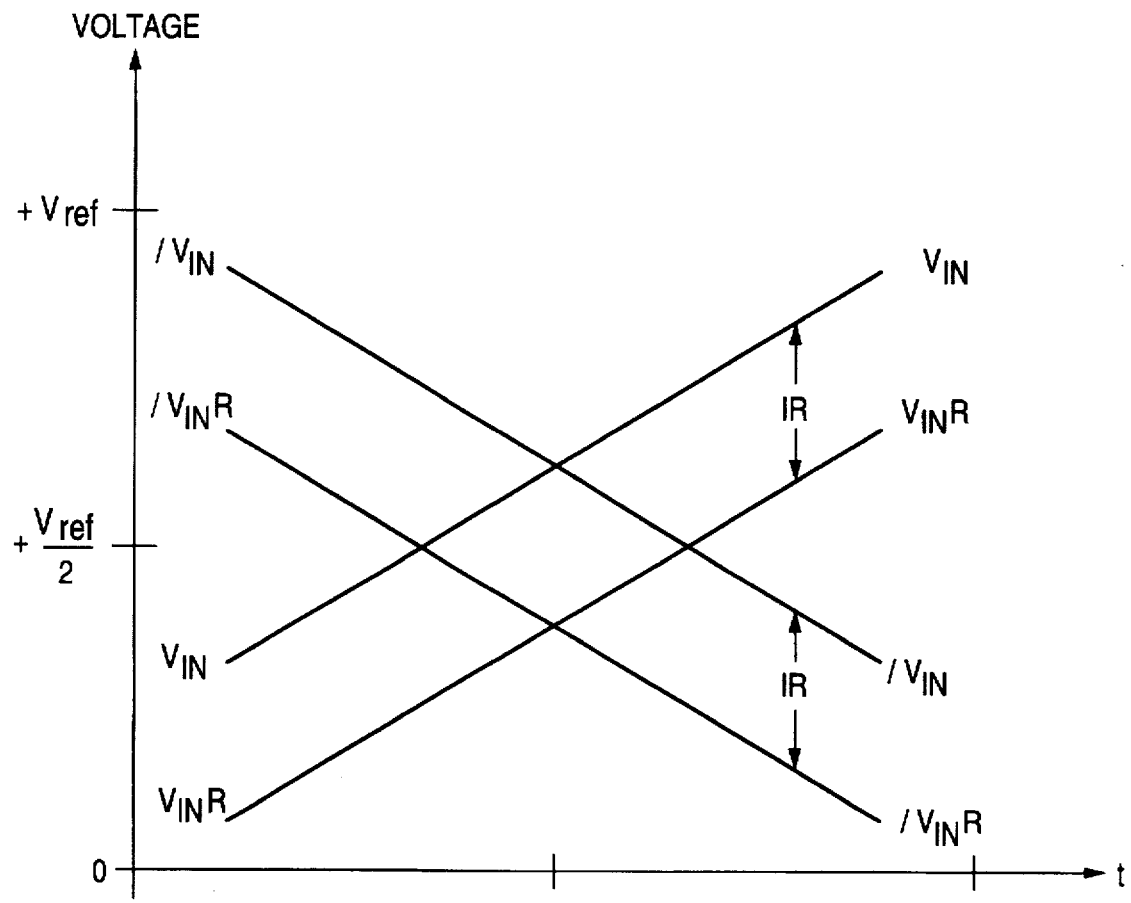
FIG. 5 illustrates the four outputs of the unclocked analog input preprocessing block according to the present invention in response to a linearly increasing analog input voltage.

The signals VinR and/VinR are produced by current sources 408 and 409 drawing currents through resistors 410 and 411 and thereby producing voltage drops that are referenced to Vin and/Vin respectively. Since resistors 410 and 411 are substantially the same and current sources 408 and 409 are substantially the same, the voltage drops will also be the same such that VinR will be offset from Vin by the same amount as/VinR is offset from/Vin. All four signals Vin,/Vin, VinR,/VinR, will change in time as the analog signal input Ain to the converter changes in time. The production of VinR by preprocessing function 400, has the effect of merging a reference offset value into the analog signal. This merging process occurs as a constant offset to Vin and is not dependent on the specific value of Vin. Likewise,/VinR is always offset from/Vin by the same constant amount regardless of the instantaneous value of/Vin. FIG. 5 shows somewhat pictorially the relationships between these four signals produced by the preprocessing function 400 of FIG. 4.

The differential buffer 401 outputs 402 and 403 are level shifted by bipolar transistors 404 and 405, respectively, to produce complementary outputs Vin and/Vin. The voltages at complementary outputs Vin 406 and/Vin 407 are typically one forward biased diode voltage drop below the voltages at the differential buffer outputs 402 and 403. Current sources 408 and 409 pull equal currents through resistors 410 and 411. If the resistors 410 and 411 each have resistances equal to R and the current sources 408 and 409 each have values equal to I, then the buffered non-inverted sub-range signal input (Vin 406) and the buffered non-inverted reference level shifted sub-range signal input (VinR 412) are related by the equation Vin=VinR+IR, while the buffered inverted sub-range signal input (/Vin 407) and the buffered inverted reference level shifted sub-range signal input (/VinR 413) are related by the equation/Vin=/VinR+IR. Moreover, Vin 406 and/Vin 407 are complementary and preferably sum to the reference voltage Vref+IR, while VinR 412 and/Vin 413 are complementary and preferably sum to Vref−IR.

FIG. 5 illustrates the four outputs of the unclocked analog input preprocessing block 400 according to the present invention such as illustrated in FIG. 4 in response to a linearly increasing analog input voltage Ain 414.

Figure 6:
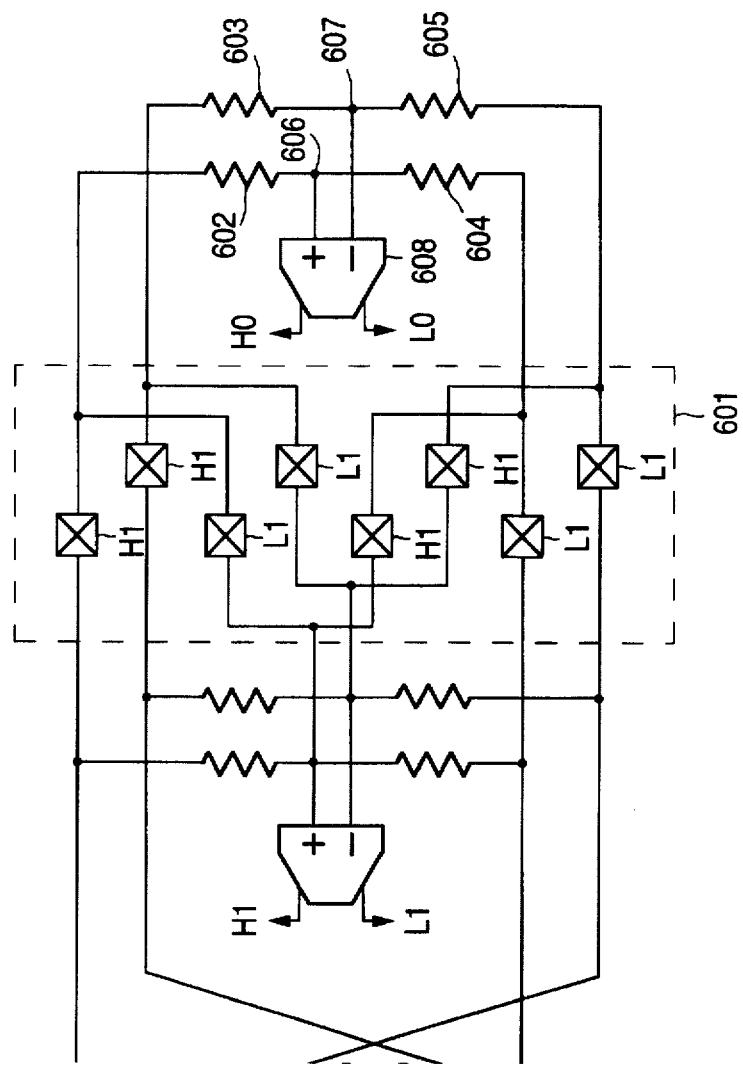
FIG. 6 illustrates an unclocked two stage radix-2 sub-ranging analog to digital converter according to an embodiment of the present invention.

FIG. 6 illustrates an unclocked two stage radix-2 sub-ranging analog to digital converter according to an embodiment of the present invention. For conversions producing a small number of output bits, the amplification of analog sub-range signals is not required; therefore, the inclusion of analog sub-range signal amplifiers are not essential to the functionality of the converter. This configuration is shown in FIG. 6.

After the first stage, the outputs of the switch bank 601 are directed to a pair of resistor chains comprised of resistors 602, 603, 604 and 605. The analog signals which are supplied to the ends of these resistor chains appear in an interpolated fashion at the nodal points 606 and 607. In this embodiment resistors 602, 603, 604 and 605 are assumed equal such that comparator 608 will have balanced inputs when the analog inputs represent the midscale of the selected sub-range from the previous stage. The output H0 of comparator 608 is the least significant bit of converter 600.

Figure 7:
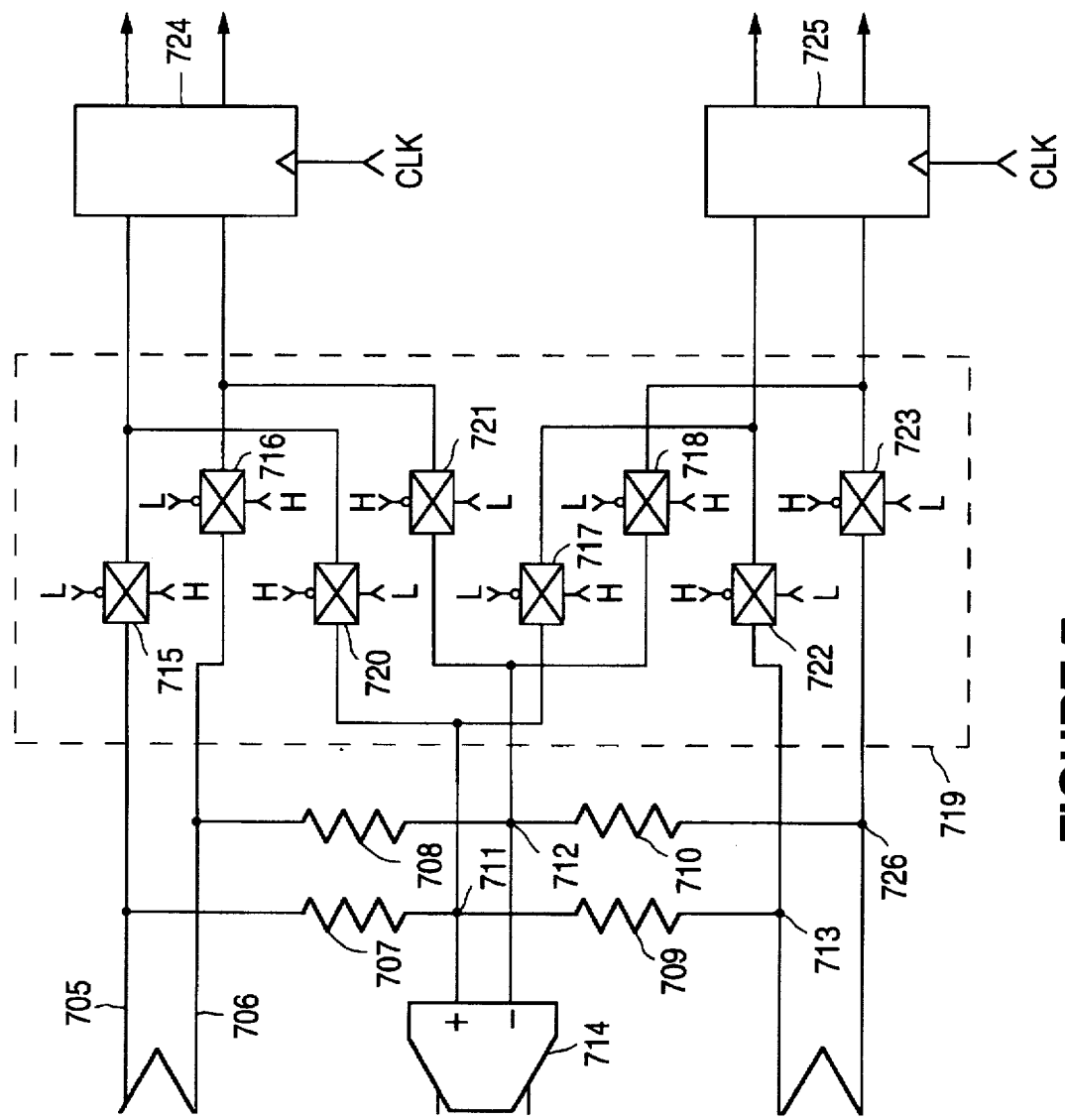
FIG. 7 illustrates a clocked radix-2 sub-ranging analog to digital converter stage according to an aspect of the present invention.
Figure 9:
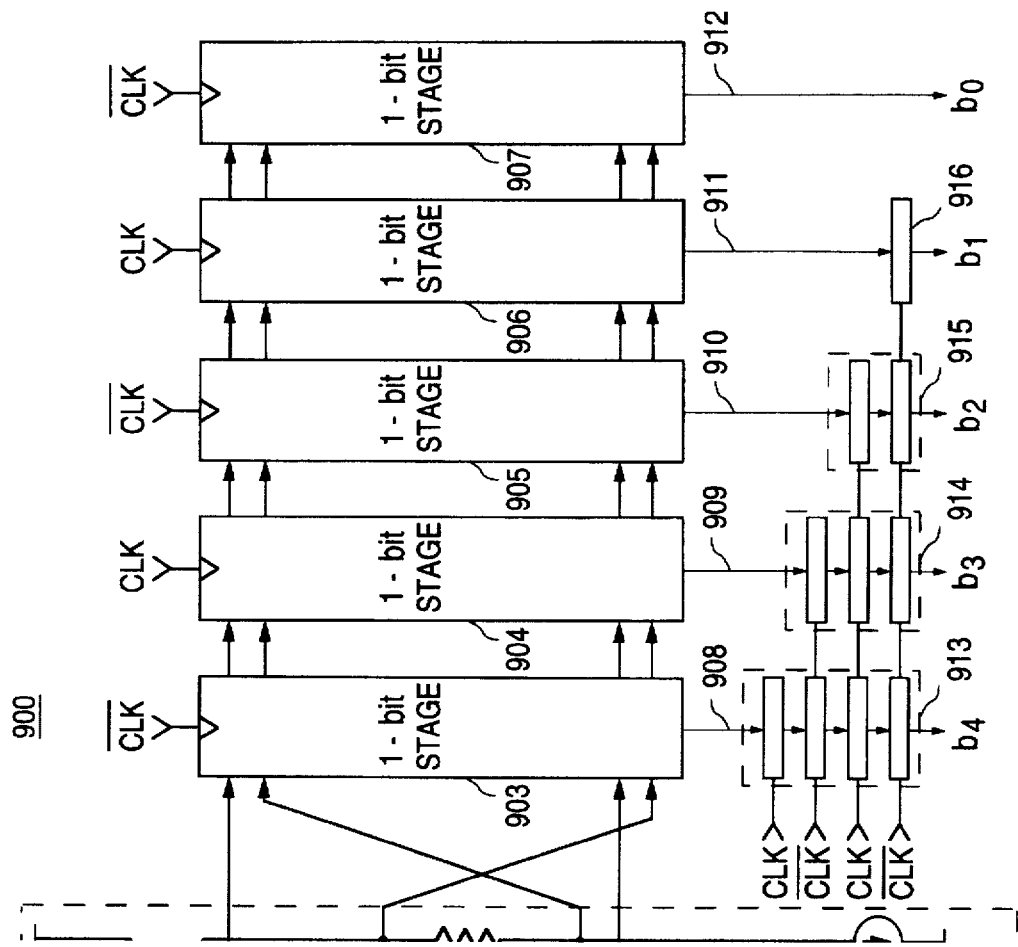
FIG. 9 illustrates a 5-bit pipelined radix-2 sub-ranging analog to digital converter according to yet another embodiment of the present invention suitable for construction using either of the stages illustrated in FIGS. 7 or 8.

The inclusion of sub-range signal amplifiers (such as illustrated in FIG. 7) serves to increase the signal amplitude relative to noise and errors from the existence of nonideal components and so improve the signal-to-noise ratio and error rejection in a real analog to digital converter such as illustrated in FIG. 9. Sub-range signal amplifiers are not essential to the functionality of the converter but are important for achieving the best possible performance in a real high resolution analog to digital converter.

FIG. 7 illustrates a clocked radix-2 sub-ranging analog to digital converter stage according to an aspect of the present invention. In FIG. 7, differential amplifier 701 receives and differentially amplifies Vin and/VinR while differential amplifier 702 receives and differentially amplifies VinR and/Vin. The precise value of the gain of amplifier 701 and the gain of amplifier 702 is not critical; however amplifier 701 and amplifier 702 should have substantially the same gain. Fabrication process variations and operating temperature variations will typically cause small variations in the gains of the amplifiers 701 and 702. Thus, although the gains of the amplifiers 701 and 702 are designed to be exactly equal to the radix of the conversion, in practice the gains will likely vary slightly from their designed values.

In conventional analog to digital amplifiers, a great amount of design effort must be expended to guarantee that the amplifier gains are exactly their designed value even under varying process and temperature conditions. In conventional converters, even slight gain variations can cause catastrophic failure of the conversions, even if the gain variances are exactly matched within any given converter or die.

In contrast, according to the present invention, slight variations in the gains of the differential amplifiers 701 and 702 are tolerable without affecting proper functioning of the converter. Similar to conventional converters, according to the present invention, it is necessary that the differential amplifiers 701 and 702 within a given stage have equal gains. However, in contrast to conventional sub-ranging converters, it is not necessary for the differential amplifiers 701 and 702 to have gains exactly equal to the radix of the stage conversion. In practice, because the differential amplifiers 701 and 702 will be laid out similarly or identically within an integrated circuit, any process or temperature variations affecting the gain of any one of the amplifiers will also affect the gain of the other amplifiers in an identical manner. Therefore, accuracy of the conversions are guaranteed even when gain variations for the amplifiers 701 and 702 are encountered.

Because amplifier 701 is a differential amplifier, when inputs Vin 703 and/VinR 704 are equal, the outputs 705 and 706 will preferably be equal. However, in practice, amplifier 701 may have an input-to-output offset which may affect the accuracy or resolution of the converter as a whole. For example, if the inputs 703 and 704 are shorted together, the voltage at output 705 may differ by an offset voltage Vofs from the voltage at output 706. These nonzero offset voltages may exist in all the amplifiers used in the converter.

The outputs of amplifiers 701 and 702 are directed to a pair of resistor chains comprised of resistors 707, 709 and 708, 710. The analog signals which are supplied to the ends of these resistor chains appear in an interpolated fashion at the nodal points 711, 712. If, for example, resistors 707 and 709 are equal in resistance, the voltage at nodal point 711 will be exactly midway between the voltages at the end points 705 and 713. The nodal points 711 and 712 are applied as inputs to the comparator 714. In this embodiment, resistors 707, 708, 709 and 710 are assumed equal such that comparator 714 will have balanced inputs when the analog inputs are half of full scale. The comparator 714 detects the threshold providing a logical "1" at output H for analog signals above mid-scale and a logical "0" at output H for analog signals below midscale. In the embodiment of the present invention illustrated in FIG. 7, the output L of comparator 714 is the logical complement of output H.

The comparator output H provides a positive logic selection control signal to the switches 715, 716, 717 and 718 in the switch bank 719. The switches in switch bank 719 are closed when their positive logic control input is a logical "1" and open when their positive logic control input is a logical "0". The comparator output L provides a positive logic control signal to the switches 720, 721, 722 and 723 in the switch bank 719.

The switches in switch bank 719 essentially implement four two-to-one analog multiplexors. In FIG. 7, the switches in switch bank 719 are illustrated as complementary transmission gates having a positive logic and negative logic control input. If implemented in CMOS, the transmission gates 715–718 and 720–723 consist of a p-channel and an n-channel transistor with sources and drains connected to the analog inputs and outputs of the switches. The negative logic control signals drive the p-channel transistors while the positive logic control signals drive the n-channel transistors. A CMOS transmission gate provides a very good analog switch. However, according to the present invention, there is no requirement that the switches are complementary transmission gates. For example, as illustrated in FIG. 6, the switches in switch bank 601 are simple n-type pass transistors having a positive logic control input but lacking a negative logic control input. Complementary two transistor transmission gates typically are more robust switches capable of transmitting voltages from among the full range of analog voltages. In contrast, single transistor pass transistor switches can only transmit voltages within a smaller range. For example, n-type pass transistors cannot accurately transmit high voltages near the positive supply voltage used to encode logical "1"s used to control their gates.

Referring back to FIG. 7, if comparator output H is a logical "1" then the switches 715–718 positively controlled by H are closed and therefore pass the upper analog sub-range signals 705, 706 and interpolated nodal voltages 711, 712 as inputs to the sample and hold amplifiers 724 and 725, respectively. Likewise, if comparator output H is a logical "0", then the comparator output L is a logical "1". In that case then the switches 720–723 controlled by L are closed and therefore pass the lower analog sub-range signals 711, 712 and 713, 726 as inputs to the sample and hold buffers 724, 725. Sample and hold buffers 724 and 725 provide one means for facilitating pipelining.

Figure 8:
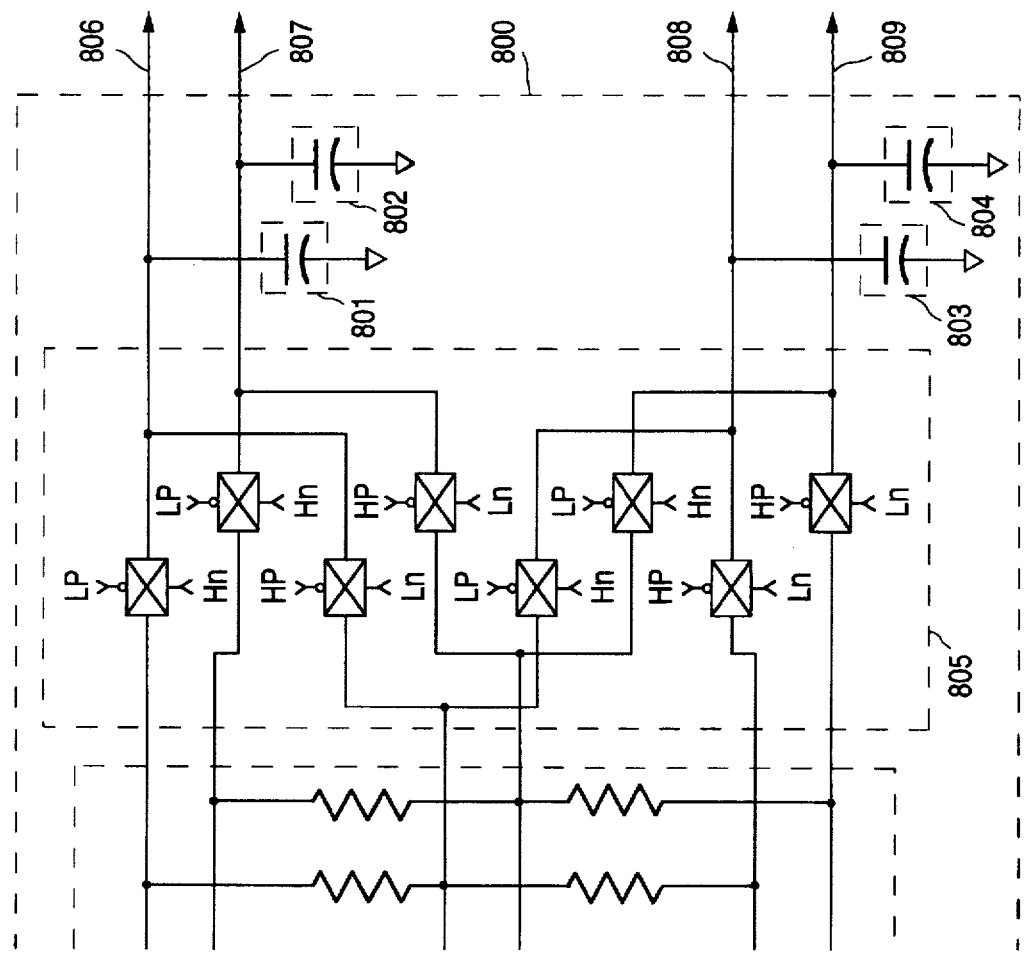
FIG. 8 illustrates a clocked radix-2 sub-ranging analog to digital converter stage according to another aspect of the present invention.

FIG. 8 illustrates a clocked radix-2 sub-ranging analog to digital converter stage 800 according to another aspect of the present invention. In FIG. 8, four hold capacitors 801, 802, 803 and 804 act in conjunction with the switches in switch bank 805 to perform the sample and hold function for the given stage. These hold capacitors 801–804 act as analog voltage storage elements, similar to the sample and hold buffers 724 and 725 in FIG. 7. The hold capacitors 801–804 allow analog signals at the outputs 806–809 of the stage to be held temporarily while the subsequent stage performs the processing of the analog signals.

The sample and hold functions implemented by the switches in the switch bank 805 and by the hold capacitors 801–804 are essential to the pipelined extension of the analog to digital converter to multiple stages. By storing intermediate results on hold capacitors, each stage can process its signals independently in a pipelined fashion. The switches in switch bank 805 illustrated in FIG. 8 must serve a dual purpose in order to support pipelining. First, the switch bank 805 acts as an analog multiplexor for sub-range selection. Second, the switch bank 805 implements the "sample" portion of the sample and hold function, while the hold capacitors 801–804 implement the "hold" function.

In order for the sub-ranging analog to digital converter stage 800 illustrated in FIG. 8 to behave in a pipelined converter, the opening and closing of the switches in the switch bank 805 must be properly timed. Therefore, a clock input 810 must be introduced into the stage 800. In the example illustrated in FIG. 8, an asynchronous comparator 811 produces complementary digital outputs H and L, which are then latched by the timing controller 812 before being output from the stage 800 as the stage's digital output. The timing controller also produces the signals Ln and Hn and Lp and Hp, which are used to control the positive logic control inputs and negative logic control inputs, respectively, of the switches in the switch bank 805. In the event that no negative logic control inputs for the switches in the switch bank 805 exist, then the signals Hp and Lp may be omitted from the circuit.

FIG. 8 illustrates the timing controller 812 as being a separate logic module aside from the comparator 812. However, this configuration is shown only by way of illustration, not by way of limitation. According to another embodiment of the present invention, the comparator 811 and the timing controller 812 are combined into a strobed comparator (not shown) which logically has the same inputs and outputs as the comparator 811 and timing controller 812.

In a pipelined converter, each stage operates on a separate conversion. Once a given stage's 1-bit conversion has been performed and the resulting sub-range signal is transferred to the hold capacitors for the next stage, all of the switches in the switch bank 805 must be opened in order to prevent younger conversions from overwriting the older conversions already in the pipeline. The switches in the switch bank 805 together with the capacitors 801–804 function as a sample and hold, or "sample-hold," circuit.

FIG. 9 illustrates a five stage, 5-bit, radix-2 pipelined sub-ranging analog-to-digital (A/D) converter 900, hereinafter referred to as converter 900, that embodies the present invention. The architecture according to the present invention eliminates the closed loop operational amplifiers found in conventional stages. This analog to digital converter also has J stages with overall analog to digital converter resolution N. Each stage resolves K bits some of which may be redundant bits used in the correction of errors made in previous stages. The redundant bits are removed by a process called digital error correction as in conventional pipe architectures. It should be appreciated at the outset that the present invention can be extended to sub-ranging analog to digital converters having any number of stages and providing digital outputs of any number of binary digits. Generally, the converter 900 includes a preprocessing function 901 which produces four signals Vin,/Vin, VinR and /VinR, in which /Vin is the analog complement of Vin and /VinR is the analog complement of VinR. This embodiment of the preprocessing function 901 is very similar to that shown in FIG. 4, with the exception that the preprocessing function 901 illustrated in FIG. 9 includes a clocked analog sample and hold buffer 902, which latches the output of the differential buffer 401 so as to allow clocked pipelined operation of the converter 900. The placement of the sample and hold buffer 902 shown in FIG. 9 is presented for illustrative purposes only; the sample and hold buffer 902 and the differential buffer 401 can be interchanged without affecting the functionality of the converter 900, although possibly affecting the minimum clock cycle of the converter 900 if the converter critical path is within the preprocessing block.

The single-to-differential buffer 401 receives the single ended analog input signal Ain and produces two complementary signals which are then sampled by a differential sample-hold amplifier circuit 902 that provides the complementary analog input signals required by the analog to digital converter stages.

The pipelined circuit 900 includes four pipeline stages 903, 904, 905 and 906 representing separate instantiations of the stage 800 illustrated in FIG. 8. The final stage 907 is an instantiation of the subcircuit 813 illustrated in FIG. 8. Because the final stage 907 does not pass any sub-range signal to any less significant stages, the final stage 907 need not include the switch matrix 805 or hold capacitors 801–804 shown in FIG. 8.

In the preferred configuration, each subsequent stage is driven by an alternate phase of the clock. Thus, the preprocessing sample and hold 902 and the second and fourth stages 904 and 906 are driven from the positive polarity of the clock CLK, while the first, third and fifth stages 903, 905 and 907 are driven by the inverted clock /CLK. The processing of any given analog to digital conversion is delayed as it progresses through the pipeline. Thus, the first stage 903 produces its digital output 908 one half clock cycle prior to the digital output 909 of the second pipeline stage 904. The digital outputs 910, 911 and 912 of the third 905, fourth 906 and fifth 912 stages are each produced with one half clock cycle delay from the preceding stage. Thus, the final stage 907 digital output 912 is produced two full clock cycles after the first stage 903 digital output 908.

In order to produce all digital output bits for a given conversion during the same clock period, a series of four latches 913 buffer the most significant digital output bit, a series of three latches 914 buffer the next most significant digital output bit, a series of two latches 915 buffer the third least significant bit b2, and a single latch 916 buffers the second least significant bit b1. The least significant digital output bit b0 is not buffered.

Figure 10:
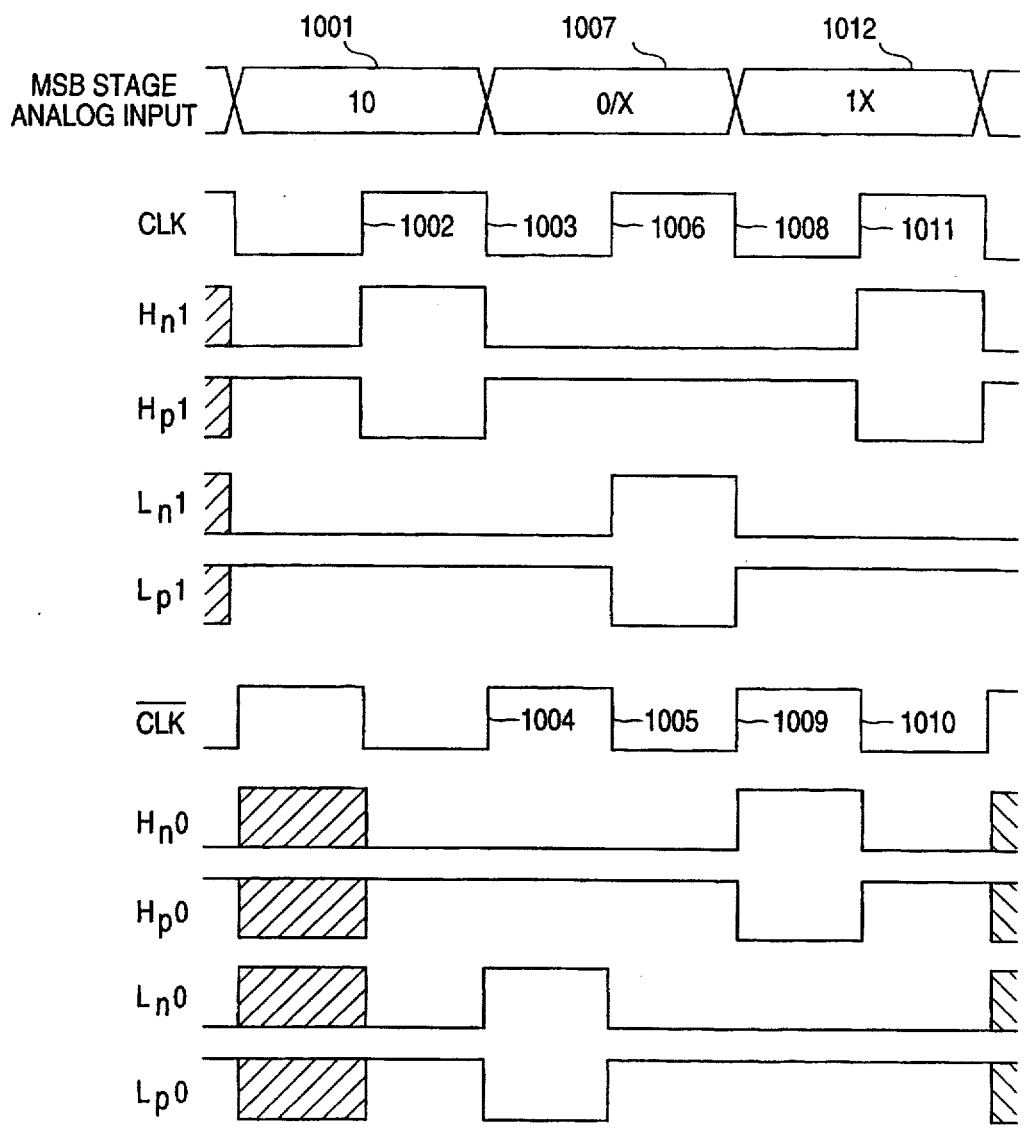
FIG. 10 is a timing diagram illustrating the various digital switch control signals and clocks corresponding to three separate 2-bit analog to digital conversions using a converter using stages such as illustrated in FIG. 8.
Figure 11:
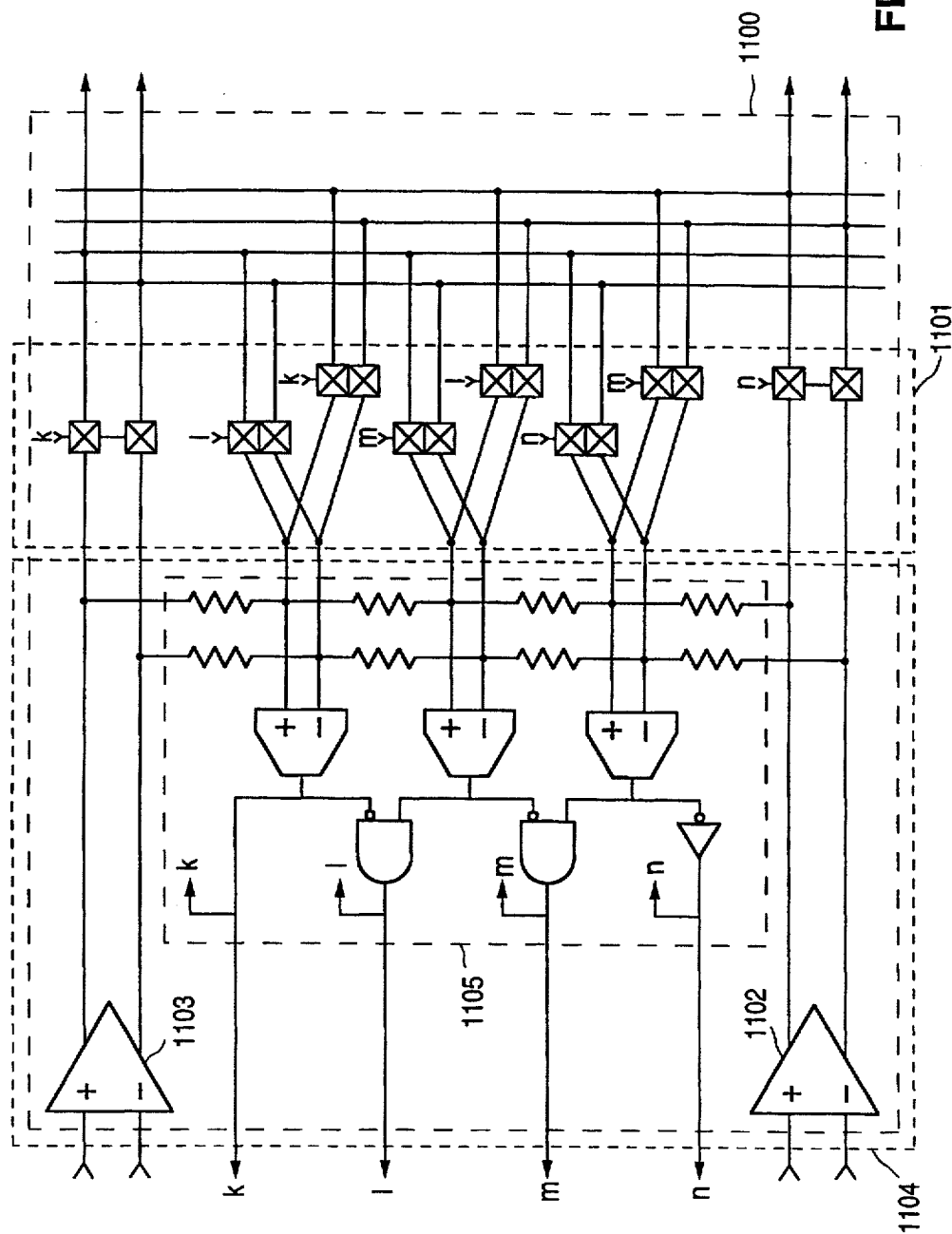

FIG. 10 is a timing diagram illustrating the various digital switch control signals and clocks corresponding to three separate 2-bit analog to digital conversions using a converter using stages such as illustrated in FIG. 8 and producing an analog sub-range signal from the least significant bit stage for further conversion by less significant stages not described herein. The 2-bit pipelined converter simulated in FIG. 10 includes a first stage clocked by the positive polarity clock CLK and a second stage clocked by the negative polarity clock /CLK.

The signal trace "MSB STAGE ANALOG INPUT" illustrates the valid time for the analog input to the most significant bit stage of the converter. During the low phase of CLK, all of the switch control signals Hn1, Hp1, Ln1 and Lp1 of the most significant bit stage are set to levels which turn the switches off. During the low phase of CLK, the comparator is settling on its bit decision. When the clock CLK goes HIGH, then the appropriate switches for the MSB stage are closed.

The least significant bit stage of the converter is clocked by /CLK. During the high phase of /CLK, all of the switch control signals Hn0, Hp0, Ln0 and Ln0 of the most significant bit stage are set to levels which mm the switches off. During the low phase of/CLK, the comparator is settling on its bit decision. When the clock /CLK goes HIGH, then the appropriate switches for the LSB stage are closed.

In the example illustrated in FIG. 10, the analog input 1001 to the first stage is at level which will ultimately yield a conversion of 10. Thus, the MSB stage detects a 1. At the rising edge 1002 of the CLK, the MSB stage detects a 1, and thus the signal Hn1 is asserted while the signal Hp1 is de-asserted. Ln1 remains de-asserted, while Lp1 remains asserted, so as to leave the switches controlled by those signals open.

While the switches controlled by Hn1 and Hp1 are closed during the high phase of the CLK, the upper subrange is transferred to the hold capacitors feeding the LSB stage. At the falling edge of CLK 1003, all of the switch control signals for the MSB stage are again set to levels that open all of the switches in the MSB stage.

During the high phase of CLK between its rising and falling edges 1002 and 1003, all of the control signals Hn0, Hp0, Ln0 and Lp0 for the LSB stage are configured so as to leave the switches of the LSB stage off as the sub-range signal from the MSB stage is being transferred to the hold capacitors. The rising edge 1004 of the inverted clock/CLK may be coincident with the falling edge 1003 of the non-inverted clock CLK, or it may be delayed by a sufficient non-overlap period. In any case, at the rising edge 1004 of the inverted clock, the switch control signal Ln0 is asserted and the switched control signal Lp0 is de-asserted as the comparator of the LSB stage detects that the sub-range signal passed to it is in the lower subrange.

At the falling edge 1005 of the inverted clock 1005, the switch control signals for the LSB stage are returned to levels which open all of the switches in the LSB stage.

Meanwhile, a second MSB stage analog input 1007 for a separate conversion is presented to the MSB stage's inputs. This analog input is at a voltage level which will ultimately lead to a conversion of 01. Coincident with the falling edge 1005 of the inverted clock/CLK or after a short non-overlap period, the rising edge 1006 of the non-inverted clock CLK triggers the assertion of Ln1 and the de-assertion of Lp1 indicating the detection of a 0 for the most significant bit stage and allowing the transferral of the resulting subrange signal to the hold capacitors feeding the LSB stage.

Coincident with or after a small non-overlap period from failing edge 1008 of the non-inverted clock CLK, the rising edge 1009 of the inverted clock/CLK triggers the assertion of the LSB switch control signal Hn0 and the de-assertion of the LSB switch control signal Hp0 indicating the detection of a 0 by the LSB stage.

At the falling edge 1010 of the inverted clock/CLK, the LSB control signals Hn0 and Hp0 close the switches in the LSB stage. Then the rising edge 1011 of the CLK signal triggers the closing of the switches corresponding to the control signals Hn1 and Hp1 in response to the third separate analog to digital conversion 1012 which will ultimately result in a conversion of 1 in the most significant bit.

As discussed above with respect to FIG. 7, it is also possible according to the present invention to use the switches in the switch bank 719 solely as a sub-range selection multiplexor function, followed by an independent sample-hold function (724 and 725). In that configuration, the timing of the control signals H and L is much simpler and the output of the comparator 714 need not be clocked, since the sample and hold buffers 724 and 725 control the timing between stages. Depending upon the design of the sample and hold buffers 724 and 725 and the required analog sampling frequency of the converter as a whole, it is possible for each pipeline stage to delay the output by one full clock cycle, or by one half clock cycle as in the stage illustrated in FIG. 8 and described in conjunction with the timing shown in FIG. 10.

Figure 11:
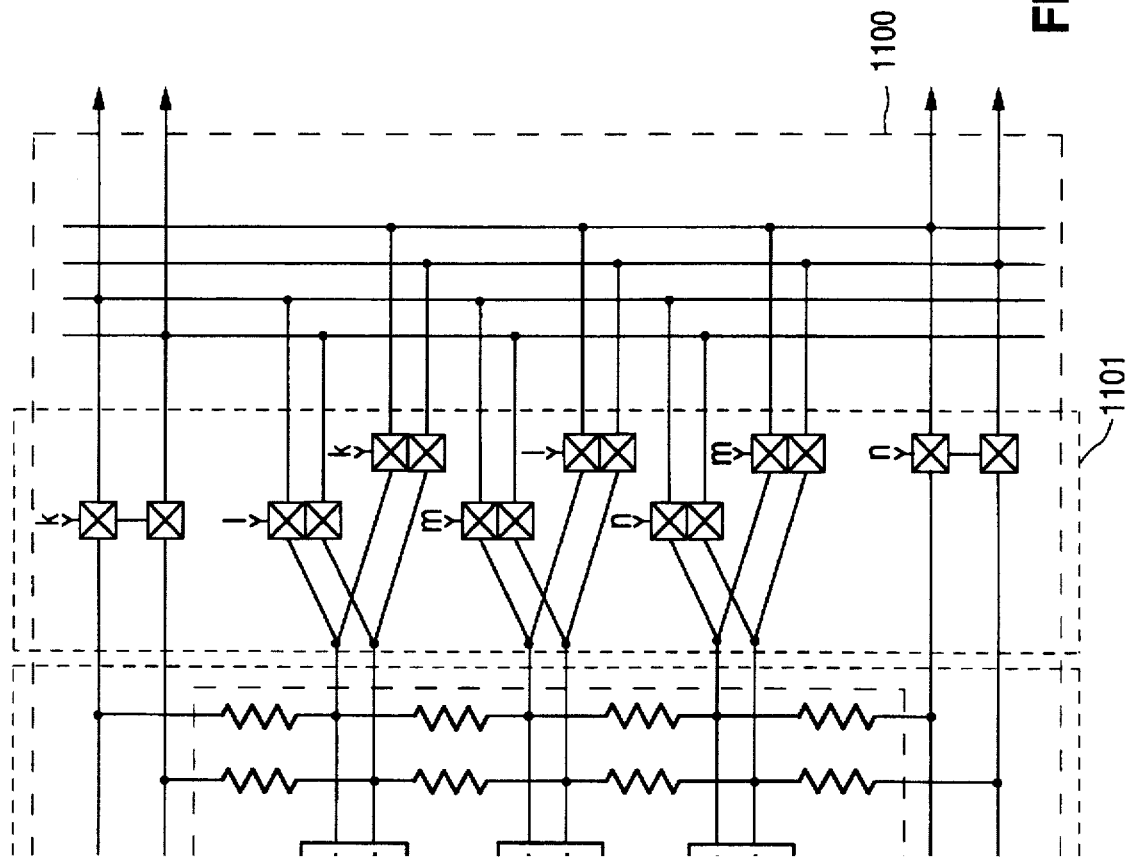
FIG. 11 illustrates an unclocked radix-4 sub-ranging analog to digital converter stage according to another aspect of the present invention.

FIG. 11 illustrates an unclocked radix-4 sub-ranging analog to digital converter stage according to another aspect of the present invention. According to another embodiment of the present invention, the analog to digital converter is extended to two or more bits per stage. FIG. 11 illustrates a converter stage resolving two bits of digital output per stage. FIG. 11 contains a flash analog to digital subconverter 1105 which provides decoded digital output bits k, l, m and n. The digital output bits k, l, m and n are "decoded" because only one of them can be asserted at any given time; therefore, only four possible states are assumed by the output signals k, l, m and n. The decoded digital output signals k, l, m and n provide the sub-range selection signals which control the switches to the switch bank 1101. As illustrated in FIG. 11, the two bit stage 1100 is asynchronous. However, the 2-bit stage 1100 is illustrated as asynchronous for illustrative purposes only. The multibit stage according to the present invention can include more than two bits per stage. Moreover, the multibit stage 1100 according to the present invention can be synchronous using either sample and hold buffers such as illustrated in FIG. 7 or having a timing controller buffering the signals k, l, m and n such as illustrated in FIG. 8 and 10.

Figure 12:
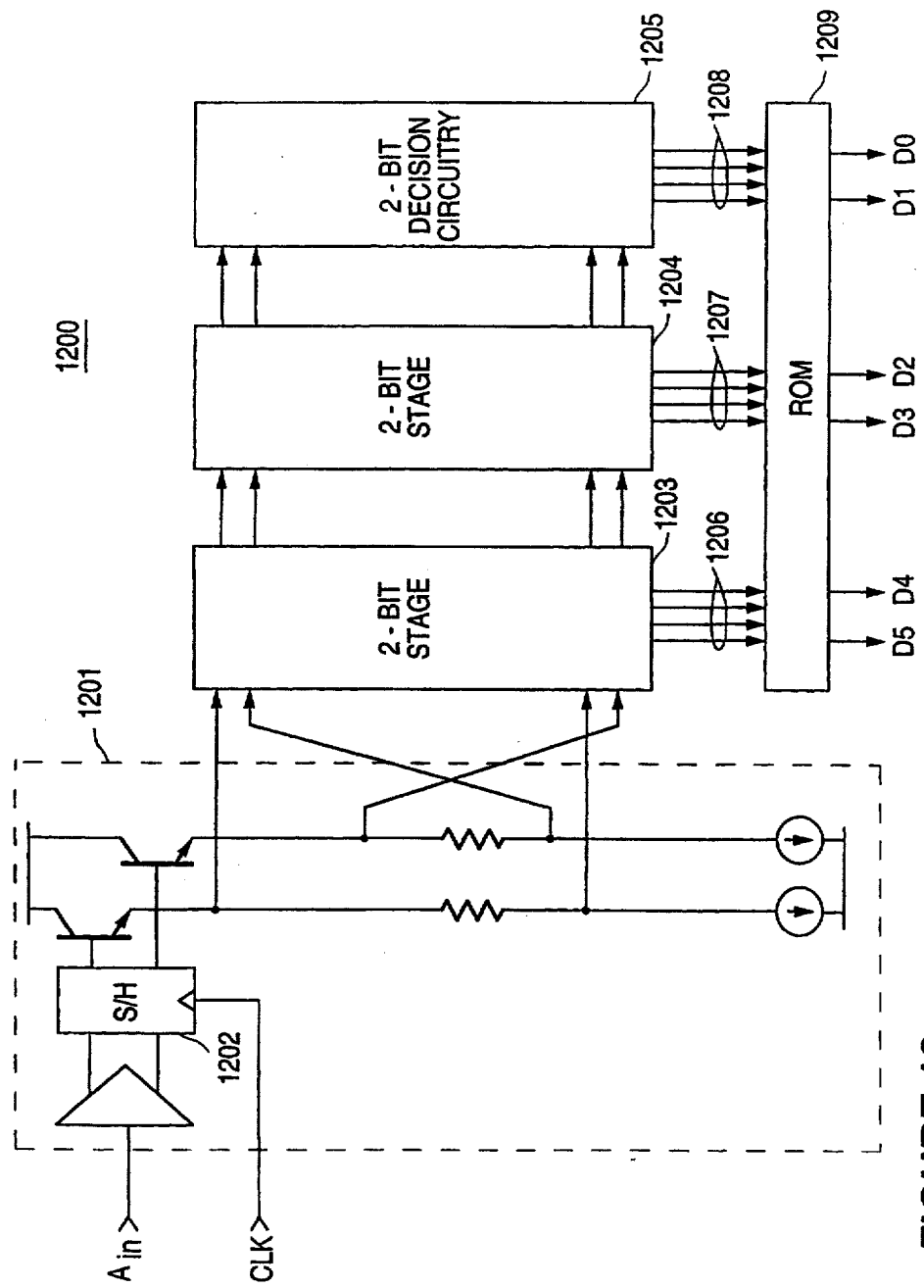
FIG. 12 illustrates a 6-bit pipelined radix-4 sub-ranging analog to digital converter according to yet another embodiment of the present invention suitable for construction using the stages illustrated in FIG. 11.

FIG. 12 illustrates a 6-bit, pipelined radix-4 sub-ranging analog to digital converter according to yet another embodiment of the present invention suitable for construction using the stages illustrated in FIG. 11. FIG. 12 illustrates a 6-bit, sub-ranging analog to digital converter 1200 constructed using 2-bit stages such as illustrated in FIG. 11. The converter 1200 includes a preprocessing block 1201 having a sample and hold buffer 1202. The converter 1200 illustrated in FIG. 12 includes 2-bit stages 1203 and 1204 which are instantiations of the circuit 1100 shown in FIG. 11. Because the final stage 1205 does not need to pass an analog sub-range signal to any subsequent stage, the final stage 1205 includes only the output bit detection circuitry 1104 illustrated in FIG. 11 but does not include the switch matrix 1101. The four decoded signals 1206 from the most significant stage 1203 represent the k, l, m and n bits from that stage. Similarly, the decoded signals 1207 represent the digital output from stage 1204, while the decoded signals 1208 represent the digital output from the least significant stage 1205. The Read Only Memory 1209 accepts the decoded output signals 1206, 1207 and 1208 as input and produces the encoded outputs D5, D4, D3, D2, D1 and D0 as output. The ROM 1209 can be implemented as three separate four entry ROMs, or alternatively as one sixty-four entry ROM. The ROM 1209 could also be implemented as combinational logic.

According to the present invention, although the exact values of the individual sub-range signal gains are not critical, the amplified sub-range signal values must remain within the power supply constraints. Therefore, for an N-bit radix-2 converter, the total gain of the n stages must not be too high such that any intermediate sub-range signal is beyond the operational range of the circuits. In practice, this positive gain error ceiling mandated by the power supplies has not constituted any problem for converters having as many as 12 fully encoded digital output bits.

Further according to the present invention, it should be noted that the gains of the fine range transfer amplifiers need not necessarily be an integer or equal to a power of two. The gains can be selected to be any value such that the desired speed and noise levels are achieved within the converter. Additionally, it is not necessary that any of the individual stages resolve a number of bits which is equal to a power of two. Any integer number of bits can be resolved, with the caveat that numbers other than powers of two result in somewhat more complicated digital processing and ROM coding.

While the present invention has been disclosed with particular reference to its embodiments, those embodiments are presented by way of example, not by way of limitation. Those of ordinary skill in the art would be enabled by this disclosure to add to or modify the embodiments of the present invention in various ways as needed and still be within the scope and spirit of the present invention. Accordingly, various changes and modifications which are obvious to a person skilled in the art to which the invention pertains are deemed to lie within the spirit and scope of the invention as claimed.

What is claimed is:

1. An apparatus including an analog-to-digital converter (ADC) stage for use in a subranging ADC system, said ADC stage comprising:

a plurality of input amplifiers configured to receive and amplify a plurality of analog input signals and in accordance therewith provide first, second, third and fourth amplified analog signals, wherein said first amplified analog signal has a first amplified voltage, said second amplified analog signal is an inverse of said first amplified analog signal and has a second amplified voltage, said third amplified analog signal has a third amplified voltage which differs from said first amplified voltage by a first voltage offset, and said fourth amplified analog signal has a fourth amplified voltage which differs from said second amplified voltage by a second voltage offset;

a signal interpolation circuit, coupled to said plurality of input amplifiers, configured to receive and interpolate said first and third amplified analog signals and receive and interpolate said second and fourth amplified analog signals and in accordance therewith provide a plurality of analog interpolation signals; and a signal comparison circuit, coupled to said signal interpolation circuit, configured to receive and compare individual ones of said plurality of analog interpolation signals and in accordance therewith provide one or more digital signals, wherein each one of said one or more digital signals includes asserted and de-asserted states.

2. The apparatus of claim 1, wherein:

said plurality of analog input signals comprises a first analog input signal which has a first input voltage, a second analog input signal which is an inverse of said first analog input signal and has a second input voltage, a third analog input signal having a third input voltage which differs from said first input voltage by said first voltage offset, and a fourth analog input signal having a fourth input voltage which differs from said second input voltage by said second voltage offset; and said plurality of input amplifiers comprises a first differential amplifier configured to differentially receive and amplify said first and fourth analog input signals and in accordance therewith provide said first and fourth amplified analog signals, and a second differential amplifier configured to differentially receive and amplify said second and third analog input signals and in accordance therewith provide said second and third amplified analog signals.

3. The apparatus of claim 1, wherein said signal interpolation circuit comprises a voltage divider circuit configured to differentially receive and divide said first and third amplified voltages and differentially receive and divide said second and fourth amplified voltages.

4. The apparatus of claim 1, wherein said signal comparison circuit comprises one or more voltage comparators, each one of which is configured to receive and compare a pair of individual ones of said plurality of analog interpolation signals and in accordance therewith provide one or more of said one or more digital signals.

5. The apparatus of claim 1, wherein said signal comparison circuit comprises:

a plurality of voltage comparators configured to receive and compare pairs of individual ones of said plurality of analog interpolation signals and in accordance therewith provide a plurality of logic signals; and a logic circuit, coupled to said plurality of voltage comparators, configured to receive and logically process said plurality of logic signals and in accordance therewith provide said one or more digital signals.

6. The apparatus of claim 1, further comprising a signal selection circuit, coupled to said signal interpolation circuit and said signal comparison circuit, configured to receive said one or more digital signals and in accordance therewith receive and select among said first, second, third and fourth amplified analog signals and said plurality of analog interpolation signals and in accordance therewith provide first, second, third and fourth analog output signals which include a pair of said plurality of analog interpolation signals.

7. The apparatus of claim 6, wherein said signal selection circuit comprises a plurality of switches, each one of which is configured to receive one of said one or more digital signals and to receive one of said first, second, third and fourth amplified analog signals or one of said plurality of analog interpolation signals and to close and open in accordance with said asserted and de-asserted states of a respective one of said one or more digital signals.

8. The apparatus of claim 6, wherein:

said signal selection circuit is configured to sample selected ones of said first, second, third and fourth amplified analog signals and said plurality of analog interpolation signals in accordance with said one or more digital signals and in accordance therewith provide first, second, third and fourth signal samples as said first, second, third and fourth analog output signals; and said ADC stage further comprises an output signal holding circuit, coupled to said signal selection circuit, configured to hold said first, second, third and fourth signal samples.

9. The apparatus of claim 8, wherein said output signal holding circuit comprises a plurality of capacitors.

10. The apparatus of claim 1, further comprising a preprocessing circuit, coupled to said plurality of input amplifiers, configured to receive said first and second analog input signals, generate said first and second voltage offsets and in accordance therewith provide said third and fourth analog input signals.

11. The apparatus of claim 10, further comprising a converter circuit, coupled to said preprocessing circuit, configured to receive and convert a single ended analog signal to a differential analog signal which forms said first and second analog input signals.

12. An apparatus including a subranging analog-to-digital converter (ADC) system comprising:

a plurality of ADC stages, each one of which includes a plurality of input amplifiers configured to receive and amplify a plurality of analog input signals and in accordance therewith provide first, second, third and fourth amplified analog signals, wherein said first amplified analog signal has a first amplified voltage, said second amplified analog signal is an inverse of said first amplified analog signal and has a second amplified voltage, said third amplified analog signal has a third amplified voltage which differs from said first amplified voltage by a first voltage offset, and said fourth amplified analog signal has a fourth amplified voltage which differs from said second amplified voltage by a second voltage offset, and a signal interpolation circuit, coupled to said plurality of input amplifiers, configured to receive and interpolate said first and third amplified analog signals and receive and interpolate said second and fourth amplified analog signals and in accordance therewith provide a plurality of analog interpolation signals; and a plurality of signal selection circuits, each one of which is coupled between an upstream ADC stage and a downstream ADC stage of said plurality of ADC stages and is configured to receive from said upstream ADC stage said one or more digital signals and in accordance therewith receive from said upstream ADC stage and select among said first, second, third and fourth amplified analog signals and said plurality of analog interpolation signals and in accordance therewith provide to said downstream ADC stage first, second, third and fourth analog output signals which include a pair of said plurality of analog interpolation signals.

13. The apparatus of claim 12, wherein:

said plurality of analog input signals comprises a first analog input signal which has a first input voltage, a second analog input signal which is an inverse of said first analog input signal and has a second input voltage, a third analog input signal having a third input voltage which differs from said first input voltage by said first voltage offset, and a fourth analog input signal having a fourth input voltage which differs from said second input voltage by said second voltage offset; and each one of said plurality of input amplifiers comprises a first differential amplifier configured to differentially receive and amplify said first and fourth analog input signals and in accordance therewith provide said first and fourth amplified analog signals, and a second differential amplifier configured to differentially receive and amplify said second and third analog input signals and in accordance therewith provide said second and third amplified analog signals.

14. The apparatus of claim 12, wherein said signal interpolation circuit comprises a voltage divider circuit configured to differentially receive and divide said first and third amplified voltages and differentially receive and divide said second and fourth amplified voltages.

15. The apparatus of claim 12, wherein said signal comparison circuit comprises one or more voltage comparators, each one of which is configured to receive and compare a pair of individual ones of said plurality of analog interpolation signals and in accordance therewith provide one or more of said one or more digital signals.

16. The apparatus of claim 12, wherein said signal comparison circuit comprises:

a plurality of voltage comparators configured to receive and compare pairs of individual ones of said plurality of analog interpolation signals and in accordance therewith provide a plurality of logic signals; and a logic circuit, coupled to said plurality of voltage comparators, configured to receive and logically process said plurality of logic signals and in accordance therewith provide said one or more digital signals.

17. The apparatus of claim 12, wherein each one of said plurality of signal selection circuits comprises a plurality of switches, each one of which is configured to receive one of said one or more digital signals and to receive one of said first, second, third and fourth amplified analog signals or one of said plurality of analog interpolation signals and to close and open in accordance with said asserted and de-asserted states of a respective one of said one or more digital signals.

18. The apparatus of claim 12, wherein:

each one of said plurality of signal selection circuits is configured to sample selected ones of said first, second, third and fourth amplified analog signals and said plurality of analog interpolation signals in accordance with said one or more digital signals and in accordance therewith provide first, second, third and fourth signal samples as said first, second, third and fourth analog output signals; and said subranging ADC system further comprises a plurality of output signal holding circuits, each one of which is coupled between a respective one of said plurality of signal selection circuits and said downstream ADC stage and is configured to hold said first, second, third and fourth signal samples.

19. The apparatus of claim 18, wherein each one of said plurality of output signal holding circuits comprises a plurality of capacitors.

20. The apparatus of claim 12, further comprising a preprocessing circuit, coupled to a first one of said plurality of ADC stages, configured to receive said first and second analog input signals, generate said first and second voltage offsets and in accordance therewith provide said third and fourth analog input signals.

21. The apparatus of claim 20, further comprising a converter circuit, coupled to said preprocessing circuit, configured to receive and convert a single ended analog signal to a differential analog signal which forms said first and second analog input signals.

22. The apparatus of claim 12, further comprising a plurality of latch circuits, each one of which is coupled to a respective selected one of said signal comparison circuits and is configured to receive and latch one of said one or more digital signals.

23. The apparatus of claim 12, further comprising an addressable storage circuit, coupled to said signal comparison circuits, configured to receive said digital signals and in accordance therewith provide a plurality of digital data.

24. A method of performing a subranging analog-to-digital signal conversion comprising the steps of:

receiving and amplifying a plurality of analog input signals and in accordance therewith generating first, second, third and fourth amplified analog signals, wherein said first amplified analog signal has a first amplified voltage, said second amplified analog signal is an inverse of said first amplified analog signal and has a second amplified voltage, said third amplified analog signal has a third amplified voltage which differs from said first amplified voltage by a first voltage offset, and said fourth amplified analog signal has a fourth amplified voltage which differs from said second amplified voltage by a second voltage offset;

interpolating said first and third amplified analog signals and interpolating said second and fourth amplified analog signals and in accordance therewith generating a plurality of analog interpolation signals; and comparing individual ones of said plurality of analog interpolation signals and in accordance therewith generating one or more digital signals, wherein each one of said one or more digital signals includes asserted and de-asserted states.

25. The method of claim 24, wherein:

said plurality of analog input signals comprises a first analog input signal which has a first input voltage, a second analog input signal which is an inverse of said first analog input signal and has a second input voltage, a third analog input signal having a third input voltage which differs from said first input voltage by said first voltage offset, and a fourth analog input signal having a fourth input voltage which differs from said second input voltage by said second voltage offset; and said step of receiving and amplifying a plurality of analog input signals and in accordance therewith generating first, second, third and fourth amplified analog signals comprises differentially receiving and amplifying said first and fourth analog input signals and in accordance therewith generating said first and fourth amplified analog signals, and differentially receiving and amplifying said second and third analog input signals and in accordance therewith generating said second and third amplified analog signals.

26. The method of claim 24, wherein said step of interpolating said first and third amplified analog signals and interpolating said second and fourth amplified analog signals and in accordance therewith generating a plurality of analog interpolation signals comprises differentially receiving and voltage dividing said first and third amplified voltages and differentially receiving and voltage dividing said second and fourth amplified voltages.

27. The method of claim 24, wherein said step of comparing individual ones of said plurality of analog interpolation signals and in accordance therewith generating one or more digital signals comprises:

comparing pairs of individual ones of said plurality of analog interpolation signals and in accordance therewith generating a plurality of logic signals; and logically processing said plurality of logic signals and in accordance therewith generating said one or more digital signals.

28. The method of claim 24, further comprising the step of selecting, in accordance with said one or more digital signals, among said first, second, third and fourth amplified analog signals and said plurality of analog interpolation signals and in accordance therewith generating first, second, third and fourth analog output signals which include a pair of said plurality of analog interpolation signals.

29. The method of claim 28, wherein:

said step of selecting, in accordance with said one or more digital signals, among said first, second, third and fourth amplified analog signals and said plurality of analog interpolation signals and in accordance therewith generating first, second, third and fourth analog output signals comprises sampling selected ones of said first, second, third and fourth amplified analog signals and said plurality of analog interpolation signals in accordance with said one or more digital signals and in accordance therewith generating first, second, third and fourth signal samples as said first, second, third and fourth analog output signals; and further comprising the step of holding said first, second, third and fourth signal samples.

30. The method of claim 29, wherein said step of holding said first, second, third and fourth signal samples comprises selectively charging a plurality of capacitors.

31. The method of claim 24, further comprising the steps of receiving said first and second analog input signals, generating said first and second voltage offsets and in accordance therewith generating said third and fourth analog input signals.

32. The method of claim 31, further comprising the step of receiving and convening a single ended analog signal to a differential analog signal which forms said first and second analog input signals.

33. The method of claim 24, further comprising the step of latching one of said one or more digital signals.

34. The method of claim 24, further comprising the step of addressing an addressable storage circuit with said digital signals and in accordance therewith generating a plurality of digital data.

* * * * *

UNITED STATES PATENT AND TRADEMARK OFFICE
CERTIFICATE OF CORRECTION

PATENT NO. : 5,739,781
DATED : Apr. 14, 1998
INVENTOR(S) : Kagey

It is certified that error appears in the above-identified patent and that said Letters Patent is hereby corrected as shown below:

The title page should be deleted to appear as per attached title page.

Please delete drawing sheets (1-12) and substitute drawing sheets (1-12) as per attached.

Signed and Sealed this

Eleventh Day of May, 1999

*Attest:*

Q. TODD DICKINSON

*Attesting Officer*  *Acting Commissioner of Patents and Trademarks*

United States Patent [19]

Kagey

[11] Patent Number: 5,739,781

[45] Date of Patent: Apr. 14, 1998

[54] SUB-RANGING ANALOG-TO-DIGITAL CONVERTER WITH OPEN-LOOP DIFFERENTIAL AMPLIFIERS

[75] Inventor: Mark R. Kagey, Fort Collins, Colo.

[73] Assignee: National Semiconductor Corporation, Santa Clara, Calif.

[21] Appl. No.: 727,056

[22] Filed: Oct. 8, 1996

[51] Int. Cl.$^6$ ............................................. H03M 1/00

[52] U.S. Cl. ..................... 341/155; 341/139; 341/158; 341/159

[58] Field of Search ................................ 341/155, 139, 341/158, 159

[56] References Cited

U.S. PATENT DOCUMENTS

| | | | |
|---|---|---|---|
| 4,686,511 | 8/1987 | Koen | 340/347 |
| 4,763,107 | 8/1988 | Koen et al. | 340/347 |
| 5,184,130 | 2/1993 | Mangelsdorf | 341/156 |
| 5,387,914 | 2/1995 | Mangelsdorf | 341/156 |
| 5,459,465 | 10/1995 | Kagey | 341/156 |
| 5,592,167 | 1/1997 | Caruso et al. | 341/159 |

OTHER PUBLICATIONS

Sehat Sutarja and Paul R. Gray, "A Pipelined 13–bit, 250–ks/s, 5–V Analog–to–Digital Converter", IEEE Journal of Solid–State Circuits, vol. 23, No. 6, Dec. 1988, pp. 1316–1323.

P. Vorenkamp and Johan P.M. Verdaasdonk, "WP 2.2" A 10b 50MS/s Pipelined ADC", 1992 IEEE International Solid–State Circuits Conference, Feb. 19, 1992, pp. 32 and 33.

*Primary Examiner*—Jeffrey A. Gaffin
*Assistant Examiner*—Jason H. Vick
*Attorney, Agent, or Firm*—Limbach & Limbach L.L.P.

[57] ABSTRACT

A sub-ranging analog to digital converter utilizes open loop differential gain amplifiers and analog switches to implement a pipeline. Each stage of the converter contains two fine range transfer amplifiers, sampling switches and hold capacitors, a low resolution sub-range analog to digital converter and a resistive ladder. The sampling switches behave as a digital to analog converter. Each stage then converts the held analog value to a digital code, which is used to operate the transfer switches to select the proper sub-range result for the next stage. The transfer switches are analog switches that perform the function of both the sampling and the sub-range transfer. The interstage amplifiers are simple open loop differential amplifiers with a rather imprecise absolute gain. Because the reference and the signal are both amplified by this imprecise gain, both the reference and the signal are amplified by the same amount. A preprocessing circuit transforms a single ended input to the analog to digital converter into four separate signals which, taken together, represent the input and reference information. Since the fine range transfer amplifiers are differential amplifiers they reject the common mode that might occur from stage to stage. However the fine range transfer amplifiers restore the signal to approximately the same common mode level at the input to each stage. Embodiments producing single or multiple output bits per stage with synchronous stages using either sub-range signal sample and hold amplifiers or dual purpose subrange transfer and sampling switches are disclosed.

34 Claims, 12 Drawing Sheets

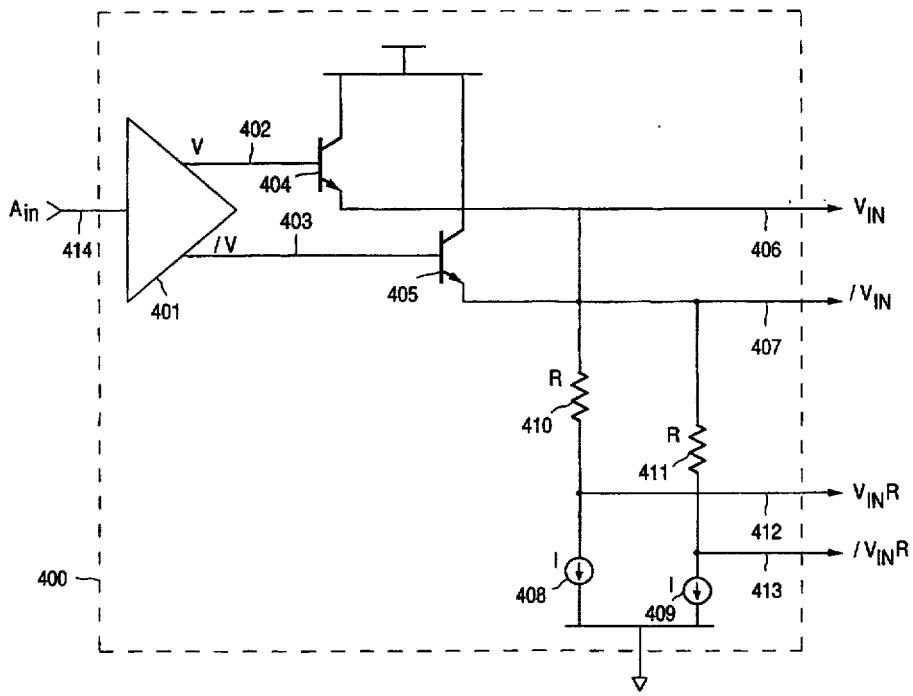

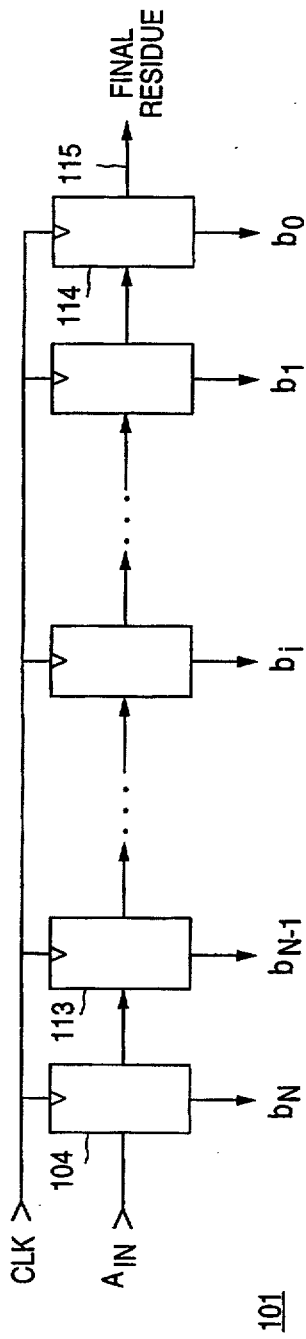
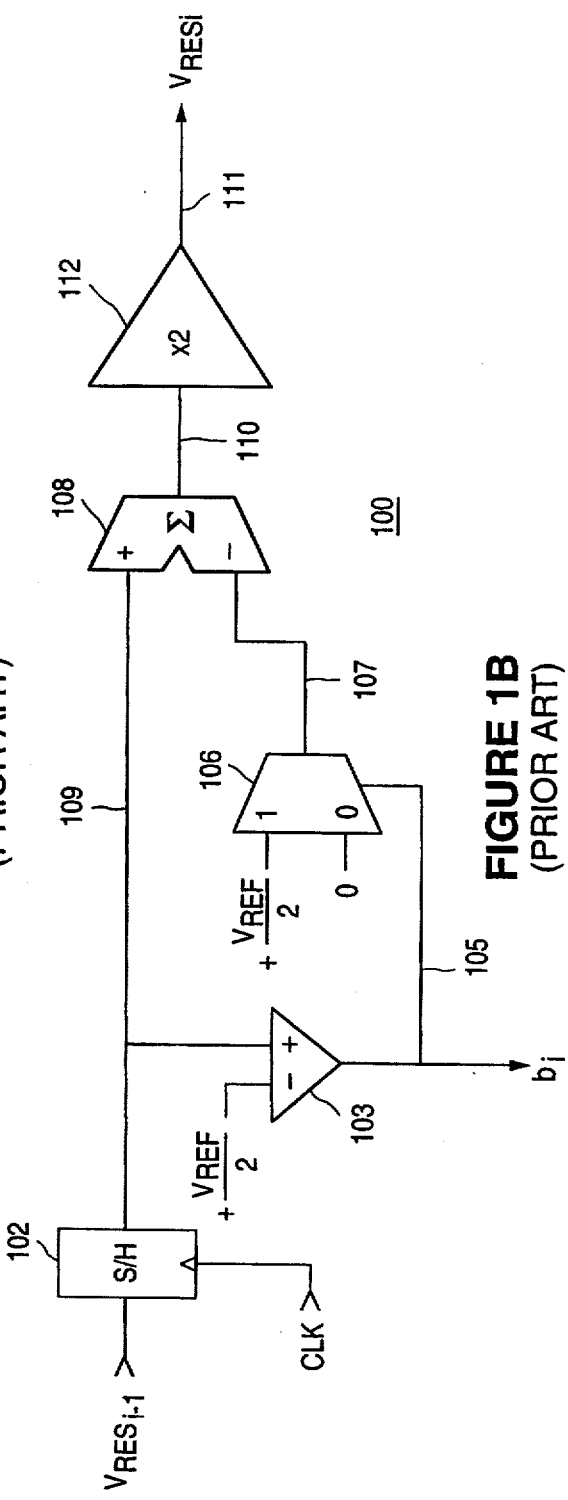
FIGURE 1A (PRIOR ART)
FIGURE 1B (PRIOR ART)